United States Patent
Tzalenchuk et al.

(10) Patent No.: US 6,791,109 B2
(45) Date of Patent: Sep. 14, 2004

(54) FINGER SQUID QUBIT DEVICE

(75) Inventors: Alexander Tzalenchuk, Göteberg (SE); Zdravko Ivanov, Gothenburg (SE); Jeremy P. Hilton, Vancouver (CA)

(73) Assignee: D-Wave Systems, Inc., Vancouver (CA)

(*) Notice: Subject to any disclaimer, the term of this patent is extended or adjusted under 35 U.S.C. 154(b) by 370 days.

(21) Appl. No.: 10/025,818

(22) Filed: Dec. 18, 2001

(65) Prior Publication Data

US 2003/0111659 A1 Jun. 19, 2003

Related U.S. Application Data

(63) Continuation of application No. 10/025,848, filed on Dec. 17, 2001, now Pat. No. 6,614,047.

(51) Int. Cl.[7] .............................................. H01L 29/06
(52) U.S. Cl. ........................................... 257/36; 257/31
(58) Field of Search ............................. 257/30, 31, 34, 257/36, 38; 438/2; 505/170, 190

(56) References Cited

U.S. PATENT DOCUMENTS

| | | |
|---|---|---|
| 5,157,466 A | 10/1992 | Char et al. |
| 5,768,297 A | 6/1998 | Shor |
| 5,917,322 A | 6/1999 | Gershenfeld et al. |
| 6,459,097 B1 | 10/2002 | Zagoskin |
| 6,495,854 B1 | 12/2002 | Newns et al. |
| 6,504,172 B2 | 1/2003 | Zagoskin et al. |
| 2001/0020701 A1 | 9/2001 | Zagoskin |
| 2002/0117656 A1 | 8/2002 | Amin et al. |
| 2002/0188578 A1 | 12/2002 | Amin et al. |

FOREIGN PATENT DOCUMENTS

WO    WO02/069411 A2    9/2002

OTHER PUBLICATIONS

Jonker et al., On Quantum & Classical Computing with Arrays of Superconducting Persistent Current Qubits, Sep. 1, 2000, IEEE Proc. 5th international workshop, 69–78.*
U.S. patent application Ser. No. 09/823,895, Amin et al., filed Mar. 31, 2001.
U.S. patent application Ser. No. 10/006,787, Tzalenchuk et al., filed Dec. 6, 2001.
G. Blatter, V.B. Geshkenbein, and L. loffe, "Engineering Superconducting Phase Qubits", ArXiv.org: cond–mat/9912163, pp. 1–8, (1999), accessed Nov. 15, 2002.
D. Born, T. Wagner, W. Krech, U. Hubner, and L. Fritzch, "Fabrication of Ultrasmall Tunnel Junctions by Electron Beam Direct–Writing", IEEE Transactions on Applied Superconductivity, 11, 373 (Mar. 2001).
Borisenko, P. Mozhaev, G. Ovsyannikov, and K. Constaninian, "Superconducting Current–Phase Dependence in High–$T_c$ Symmetrical Bicrystal Junctions", SQUID 2001 conference proceedings (Sep. 2, 2001) also as Physica C 368, pp. 328–331 (2002).

(List continued on next page.)

*Primary Examiner*—Douglas Wille
(74) *Attorney, Agent, or Firm*—Jones Day; Brett Lovejoy

(57) ABSTRACT

A finger SQUID qubit device and method for performing quantum computation with said device is disclosed. A finger SQUID qubit device includes a superconducting loop and one or more superconducting fingers, wherein the fingers extend to the interior of said loop. Each finger has a mesoscopic island at the tip, separated from the rest of the finger by a Josephson junction. A system for performing quantum computation with the finger SQUID qubit device includes a mechanism for initializing, entangling, and reading out the qubits. The mechanism may involve passing a bias current across the leads of the superconducting loop and a mechanism for measuring a potential change across the leads of the superconducting loop. Furthermore, a control system includes a mechanism for addressing specific qubits in a quantum register of finger SQUID devices.

35 Claims, 16 Drawing Sheets

OTHER PUBLICATIONS

H. Hilgenkamp, J. Mannhart, and B. Mayer, "Implications of dx2–y2 symmetry and faceting for the transport properties of grain boundaries in high-$T_c$ superconductors", Physical Review B 53, pp. 14586–14593 (1996).

E. Il'ichev, M. Grajcar, R. Hlubina, R. Ijsselsteijn, H. Hoenig, H. Meyer, A. Golubov, M. Amin, A. Zagoskin, A. Omelyanchouk, and M. Kupriyanov, "Degenerate Ground State in a Mesoscopic $YBa_2Cu_3O_{7-x}$ Grain Boundary Josephson Junction", Physical Review Letters 86, pp. 5369–5372 (2001).

P Joyez, P. Lafarge, A. Filipe, D. Esteve, and M. H. Devoret, "Observation of Parity–Induced Suppression of Josephson Tunneling in the Superconducting Single Electron Transistor", Physical Review Letters 72, pp. 2458–2461 (1994).

D. Koelle, R. Kleiner, F. Ludwig, E. Dantsker and John Clark, "High–transition–temperature superconducting quantum interference devices", Reviews of Modern Physics 71, pp. 631–686 (1999).

D. Lidar, and L. Wu, "Reducing Constraints on Quantum Computer Design by Encoding Selective Recoupling", ArXiv.org: quant–ph/0109021 version 2, pp. 1–5 (2001), accessed Jan. 17, 2003.

Y. Makhlin, G. Schön, and A. Shnirman, "Quantum–State Engineering with Josephson–Junction Devices", Reviews of Modern Physics 73, pp. 357–400 (2001).

J.E. Mooij, T.P. Orlando, L. Levitov, L. Tian, C.H. van der Wal, and S. Lloyd, "Josephson Persistent–Current Qubit", Science 285, pp. 1036–1039 (1999).

S. Nicoletti, H. Moriceau, J.C. Villegier, D. Chateigner, B. Bourgeaux, C. Cabanel, and J. Y. Laval, "Bi–epitaxial YBCO grain boundary Josephson junctions on $SrTiO_3$ and sapphire substrates", Physica C 269, pp.255–267 (1996).

R.C. Rey–de–Castro, M.F. Bocko, A.M. Herr, C.A. Mancini, and M.J. Feldman, "Design of an RSFQ Control Circuit to Observe MQC on an rf–SQUID", IEEE Transactions on Applied Superconductivity 11, pp. 1014–1017 (2001).

R.R. Schulz, B. Chesca, B. Goetz, C.W. Schneider, A. Schmehi, H. Bielefeldt, H. Hilgenkamp, J. Mannhart, and C.C. Tsuei, "Design and realization of an all d–wave dc–superconducting quantum interference device", Applied Physics Letters 76, pp. 912–914 (2000).

R.J. Schoelkopf, P. Wahlgren, A.A. Kozhevnikov, P. Delsing, and D.E. Prober, "The Radio–Frequency Single–Electron Transistor (RF–SET): A Fast and Ultrasensitve Electrometer", Science 280, pp. 1238–1242 (1998).

F. Tafuri, F. Carillo, F. Lombrdi, F. Miletto Granozio, F. Ricci, U. Scotti di Uccio, A. Barone, G. Testa, E. Sarnelli, J.R. Kirtley, "Feasibility of Biepitaxial YBaCuO Josephson Junctions for Fundamental Studies and Potential Circuit Implementation", ArXiv.org: condmat/0010128 (2000), accepted for publication Phys. Rev. B, accessed Dec. 18, 2002.

C. C. Tsuei and J. R. Kirtley, "Pairing symmetry in cuprate superconductors", Reviews of Modern Physics 72, Issue 4, pp. 969–1016 (2000).

D. J. Van Harlingen, "Phase–sensitive tests of the symmetry of the pairing state in the high–temperature superconductors—Evidence for $d_{x^2-y^2}$ symmetry", Reviews of Modern Physics 67, 515–535 (1995).

C. H. van der Wal, A. C. J. ter Haar, F. K. Wilhelm, R. N. Schouten, C. J. P. M. Harmans, T. P. Orlando, S. Lloyd, and J. E. Mooij, "Quantum Superposition of Macroscopic Persistent–Current States", Science, 290, pp. 773–777 (2000).

* cited by examiner

US 6,791,109 B2

FINGER SQUID QUBIT DEVICE

RELATED APPLICATIONS

This application is a continuation of U.S. application Ser. No. 10/025,848, filed Dec. 17, 2001, now U.S. Pat. No. 6,614,047, by the same inventors, which is herein incorporated by reference in its entirety.

BACKGROUND

1. Field of the Invention

This invention relates to quantum computing and, in particular, to superconducting quantum computing systems.

2. Description of Related Art

Research on what is now called quantum computing traces back to Richard Feynman. See, e.g., R. P. Feynman, Int. J. Theor. Phys. 21, 467 (1982). He noted that quantum systems are inherently difficult to simulate with classical (i.e., conventional, non-quantum) computers, but that this task could be accomplished by observing the evolution of another quantum system. In particular, solving a theory for the behavior of a quantum system commonly involves solving a differential equation related to the system's Hamiltonian. Observing the behavior of the system provides information regarding the solutions to the equation.

Further efforts in quantum computing were initially concentrated on building the formal theory or on "software development" or extension to other computational problems. Discovery of the Shor and Grover algorithms were important milestones in quantum computing. See, e.g., P. Shor, SIAM J. of Comput. 26, 1484 (1997); L. Grover, Proc. 28th STOC, 212 (ACM Press, New York, 1996), which is hereby incorporated by reference in its entirety; and A. Kitaev, LANL preprint quant-ph/9511026, which is hereby incorporated by reference in its entirety. In particular, the Shor algorithm permits a quantum computer to factorize large natural numbers efficiently. In this application, a quantum computer could render obsolete all existing "public-key" encryption schemes. In another application, quantum computers (or even a smaller-scale device such as a quantum repeater) could enable absolutely safe communication channels where a message, in principle, cannot be intercepted without being destroyed in the process. See, e.g., H. J. Briegel et al., preprint quant-ph/9803056 and references therein, which is hereby incorporated by reference in its entirety. Showing that fault-tolerant quantum computation is theoretically possible opened the way for attempts at practical realizations. See, e.g., E. Knill, R. Laflamme, and W. Zurek, Science 279, 342 (1998), which is hereby incorporated by reference in its entirety.

Quantum computing generally involves initializing the states of N qubits (quantum bits), creating controlled entanglements among them, allowing these states to evolve, and reading out the states of the qubits after the evolution. A qubit is conventionally a system having two degenerate (i.e., of equal energy) quantum states, with a non-zero probability of being found in either state. Thus, N qubits can define an initial state that is a combination of $2^N$ classical states. This initial state undergoes an evolution, governed by the interactions that the qubits have among themselves and with external influences. This evolution of the states of N qubits defines a calculation or, in effect, $2^N$ simultaneous classical calculations. Reading out the states of the qubits after evolution is complete determines the results of the calculations.

Several physical systems have been proposed for the qubits in a quantum computer. One system uses molecules having degenerate nuclear-spin states. See N. Gershenfeld and I. Chuang, "Method and Apparatus for Quantum Information Processing," U.S. Pat. No. 5,917,322, which is hereby incorporated by reference in its entirety. Nuclear magnetic resonance (NMR) techniques can read the spin states. These systems have successfully implemented a search algorithm, see, e.g., M. Mosca, R. H. Hansen, and J. A. Jones, "Implementation of a quantum search algorithm on a quantum computer," Nature 393, 344 (1998) and references therein, which is hereby incorporated by reference in its entirety, and a number-ordering algorithm, see, e.g., L. M. K. Vandersypen, M. Steffen, G. Breyta, C. S. Yannoni, R. Cleve, and I. L. Chuang, "Experimental realization of order-finding with a quantum computer," preprint quant-ph/0007017 and references therein, which is hereby incorporated by reference in its entirety. (The number-ordering algorithm is related to the quantum Fourier transform, an essential element of both Shor's factoring algorithm and Grover's algorithm for searching unsorted databases.) However, expanding such systems to a commercially useful number of qubits is difficult. More generally, many of the current proposals will not scale up from a few qubits to the $10^2 \sim 10^3$ qubits needed for most practical calculations.

Further, current methods for entangling qubits are susceptible to loss of coherence. Entanglement of quantum states of qubits can be an important step in the application of quantum algorithms. See for example, P. Shor, SIAM J. of Comput., 26:5, 1484-1509 (1997), which is hereby incorporated by reference in its entirety. Current methods for entangling phase qubits require the interaction of the flux in each of the qubits, see Yuriy Makhlin, Gerd Schon, Alexandre Shnirman, "Quantum state engineering with Josephson-junction devices," LANL preprint, cond-mat/0011269 (November 2000), which is hereby incorporated by reference in its entirety. This form of entanglement is sensitive to the qubit coupling with surrounding fields, which cause decoherence and loss of information.

As discussed above, currently proposed methods for readout, initialization, and entanglement of a qubit involve detection or manipulation of magnetic fields at the location of the qubit, which make these methods susceptible to decoherence and limits the overall scalability of the resulting quantum computing device. Thus, there is a need for an efficient quantum register where decoherence and other sources of noise is minimized but where scalability is maximized.

SUMMARY OF THE INVENTION

In accordance with the present invention, a quantum register is presented. A quantum register according to the present invention includes one or more finger SQUID qubit devices.

A finger SQUID qubit device according to an embodiment of the present invention can include a superconducting loop and a superconducting finger, wherein the superconducting finger extends from the superconducting loop towards the interior of the superconducting loop. The superconducting loop may have multiple branches. Each branch may have a Josephson junction. The Josephson junction may be a grain boundary junction. The finger SQUID qubit device may have leads capable of conducting current to and from the superconducting loop. The leads may be capable of conducting supercurrent.

When structures are referred to as "superconducting" herein, they are fabricated from a material capable of superconducting and so may superconduct under the correct conditions. For example, the superconducting loop and superconducting finger may be fabricated from a d-wave superconductor and so will superconduct under appropriate physical conditions. For example, the superconducting loop and finger will superconduct at an appropriate temperature, magnetic field, and current. However, the "superconducting loop" will not superconduct under other physical conditions. For example, when the temperature is too high, the superconducting loop will not be in a superconducting state. Additionally, structures such as superconducting SETs and other superconducting switches mentioned herein are capable of superconducting under appropriate physical conditions.

A device in accordance with an embodiment of the invention generally operates at a temperature such that thermal excitations in the superconducting crystal lattice are sufficiently suppressed to perform quantum computation. In some embodiments of the invention, such a temperature can be on the order of 1K or less. In some other embodiments of the invention, such a temperature can be on the order of 50 mK or less. Furthermore, other dissipative sources, such as magnetic fields for example, should be minimized to an extent such that quantum computing can be performed with a minimum of dissipation and decoherence.

The material capable of superconducting used in embodiments of the invention may be a material that violates time-reversal symmetry. For example, a d-wave superconductor may be used. For example, the d-wave superconductors $YBa_2Cu_3O_{7-x}$, $Bi_2Sr_2Ca_{n-1}Cu_nO_{2n+4}$, $Tl_2Ba_2CuO_{6+x}$, and $HgBa_2CuO_4$ may be used.

According to some embodiments of the present invention, the superconducting finger includes a Josephson junction, such that a mesoscopic island is separated from the rest of the superconducting finger by the junction.

For the Josephson junctions in the branches or the finger, the orientation of the superconducting order parameter on one side of the Josephson junction may be different from the orientation of the superconducting order parameter on the other side of the Josephson junction. For example, the orientation of the superconducting order parameter in the region above the Josephson junction may be rotated approximately 45 degrees with respect to the orientation of the superconducting order parameter below the Josephson junction. Other non-zero misorientations may be used to form a grain boundary Josephson junction. The orientation of the superconducting order parameter in the region above the Josephson junction may be rotated with respect to the orientation of the grain boundary. The orientation of the superconducting order parameter in the region below the Josephson junction may be rotated with respect to the orientation of the grain boundary.

The orientation of the superconducting order parameter is related to the orientation of the crystal lattice of the superconductor. Therefore, the orientation of the superconducting order parameter is generally controlled by controlling the orientation of the crystal lattice. For example, bi-epitaxial fabrication methods can be used to achieve the desired orientation of the superconducting order parameter in regions adjacent to the grain boundary. Alternately, bi-crystal fabrication methods may be used to achieve the desired orientation of the superconducting order parameter in regions adjacent to the grain boundary.

In a qubit device as presented in embodiments of the current invention, the superconducting finger, including the mesoscopic island region, forms a qubit as explained below, and the surrounding superconducting loop allows interaction with and control of the qubit. The loop and finger together, then, can be referred to as the qubit device.

If the order parameter in a first region of the loop, from which the finger extends, has a phase of $\Phi$, a phase $\Phi \pm \Delta\Phi$ is accumulated in the order parameter across the Josephson junction in the finger. The sign of the phase change depends on the direction of circulation of the ground state supercurrent. The qubit has two bistable phase states, corresponding to the change in phase $+\Delta\Phi$ or $-\Delta\Phi$ of the order parameter across the Josephson junction in the finger. Therefore, the region of qubit device including the finger and the region of the loop from which the finger extends can then be referred to as the qubit. Additionally, the two bi-stable phase states form the basis states of the qubit can be referred to as the $|+\Delta\Phi>$ and $|-\Delta\Phi>$ states, with measurable qubit phase change values of $+\Delta\Phi$ and $-\Delta\Phi$. For operation as a qubit, these states are referred to as the basis states $|0>$ and $|1>$.

Although the measurable values of the qubit phase change are equal to $+\Delta\Phi$ or $-\Delta\Phi$, in a quantum computing device the qubit phase is generally not directly measured. The term "measurable value" here refers to the quantum mechanical use of the term, where a measurable value is a physical attribute of a system that can be described by an operator in the system's Hilbert space (such as energy, position or momentum). In making an actual measurement, a current may be provided through a qubit device and a resulting voltage across the qubit device will be measured. The measured voltage will depend on the state of the qubit. That is, the measured voltage will be different if the qubit is in the basis state corresponding to a measurable value of the qubit phase difference of $+\Delta\Phi$ than if the qubit is in the basis state corresponding to a measurable value of the qubit phase difference of $-\Delta\Phi$.

In some embodiments of the current invention, a control system is included. The control system may provide current to the superconducting leads of a qubit device as described above. The control system may also measure a voltage change across the leads, may convert a measured voltage change to a qubit value, may store the qubit value, and/or may store the measured voltage change. The qubit value corresponds to one of the two qubit basis states described above, but in this example the quantities $+\Delta\Phi$ and $-\Delta\Phi$ are not directly measured. Instead, the qubit value may be stored as a voltage, as a 1 or a 0, or as some other parameter.

In some embodiments of the invention, the orientation of the grain boundary forming the junction can be tilted with respect to the orientation of the branches of the superconducting loop. This can alter the phase of the superconducting ground state beyond the shift caused by the misorientation of the superconductor crystal lattice with the corresponding grain boundary. Alternately, one or more of the branches of the superconducting loop can be tilted with respect to the orientation of the grain boundaries forming the grain boundary Josephson junctions.

Further, the branches or the grain boundaries forming the Josephson junctions in the branches can have a different tilt angle with respect to one another, such that the junctions in each branch can correlate with a different ground state phase difference. Again, this ground state phase difference may be accompanied by a ground state phase difference caused by the misorientation of the superconductor crystal lattice with the corresponding grain boundary. Furthermore, said ground state phase difference across the junctions in the branches of the superconducting loop can be different from the ground state phase difference across the junction isolating the island on the superconducting finger. The ground state phase difference can depend on the direction of the grain boundary with respect to the orientation of the superconducting order parameter above and below the grain boundary or on direction of the grain boundary with respect to the branch.

In some embodiments of the invention, a link may be provided between the superconducting loop and the mesoscopic island of a qubit device as described above. The link may include a switching mechanism. The switching mechanism may be a coherent switching mechanism such as a parity key or superconducting SET.

In some embodiments of the invention, a link may be provided between the mesoscopic island of a qubit device as described above and a ground. The link may include a switching mechanism. The switching mechanism may be a coherent switching mechanism such as a parity key or superconducting SET.

In some embodiments of the quantum register, the magnitude of $\Delta\Phi$ may differ between qubit devices depending on the characteristics of each qubit device. Such a difference does not affect the ability of the qubit devices to be used in quantum computing. Further, by controlling the fabrication of the qubit devices so that differences between devices are minimal, the magnitude of the qubit phase may only slightly vary among devices. However, even though the magnitude of the qubit phase corresponding to one of the qubit basis states may differ among devices, for each particular qubit device there are doubly degenerate basis states as described above which correspond to two measurable values of qubit phase.

In some embodiments of the current invention, a quantum register includes multiple qubit devices. Each qubit device may include one or more qubits. In an embodiment where a quantum register includes a first qubit device and a second qubit device, the first qubit device may be coupled to the second qubit device by providing a coupling link between a mesoscopic island of the first device and a mesoscopic island of a second device. The coupling link can include a coupling switch, such that when the coupling switch is in the closed position it conducts current. In some embodiments, the coupling link can coherently conduct supercurrent. The coupling switch may be a superconducting SET or a parity key.

In some embodiments of the invention, a quantum register includes one or more superconducting loops. Each superconducting loop may include multiple fingers extending from the loop toward the interior of the loop. Each finger may include a Josephson junction separating a mesoscopic island from the rest of the finger.

In some embodiments of the invention, a quantum register may include a plurality of superconducting loops, where each loop has a finger extending from the loop towards its interior. Each finger may have a Josephson junction separating a mesoscopic island from the rest of the finger.

In some embodiments of the invention, a method of performing a calculation with a quantum computer may include providing a quantum register. The quantum register may include multiple qubit devices as described above. The method of performing a calculation may include initializing the qubit devices to one of the qubit basis states. The method may include coupling one of the qubit devices to another of the devices, so that the quantum states of each of the qubit devices are entangled. The method may include reading the result of the calculation. Reading the result of the calculation may include collapsing the qubit wavefunction into one of its basis states. The method may include storing the results of the calculation in a memory.

Embodiments of the invention can include a method for initializing a qubit. The method can include providing a qubit device as described above, where the qubit has two basis states, $\oplus\alpha\Delta\Phi>$ and $|-\Delta\Phi>$. The method can include initializing the qubit by setting the qubit phase to one of the two ground state values. The state of the qubit can be localized to a single ground state by connecting the mesoscopic island of the qubit device to a ground. Alternately, the qubit state can be set by coupling the mesoscopic island of the qubit device to the superconducting loop of the qubit device. The qubit state may be set by driving a bias current across the leads of the superconducting loop.

Embodiments of the invention can include performing an entanglement operation. An entanglement operation may be performed by coupling two or more qubit devices. For example, an entanglement operation may be performed by providing a first qubit device and a second qubit device as described above, then coupling the first qubit device to the second qubit device. The first qubit device may be coupled to the second qubit device by providing a link between the mesoscopic island of the first qubit device and the mesoscopic island of the second qubit device. The link may include a coherent superconducting switch. The coherent superconducting switch can be a superconducting SET or a parity key. In another embodiment, the first qubit device can be coupled to the second qubit device by providing a superconducting loop between the first qubit device and the second qubit device. The superconducting loop can include a switch such that when the switch is closed the superconducting loop is inductively coupled to the first qubit and the second qubit.

Multiple qubits may be entangled by coupling as described above. For example, a first qubit device may be coupled to a second qubit device as described above. Additionally, the first qubit device may be coupled to a third qubit device. The first qubit device may be coupled to the second qubit device and the third qubit device at the same time. The multiple qubit devices may be arranged in a one-dimensional array, a two-dimensional array, or a three-dimensional array.

Some embodiments of the invention include a method for performing a bias operation on a qubit. The method can include providing a qubit device as described above. The method can further include linking the mesoscopic island of the qubit device to the superconducting loop of the qubit device. The linking can be accomplished using a coherent switching mechanism. The coherent switching mechanism can be a superconducting SET or a parity key.

In some embodiments of the current invention, a method for performing a bias operation can include providing a qubit device as described above. The method can include driving a bias current across the leads of the qubit device. Driving the current in a first direction can bias the qubit to one of the two qubit basis states, while driving the current in the opposite direction can bias the qubit to the other of the two qubit basis states.

In some embodiments of the current invention, a method of reading out the state of a qubit device can include providing a qubit device as described above. The method may include coupling the mesoscopic island of the qubit device to the superconducting loop of the qubit device. The method may further include driving a bias current through the leads of the qubit device. The method may include measuring a voltage change across the leads of the qubit device. The method may include storing the measured voltage change or storing a qubit value corresponding to the measured voltage change in a memory.

In some embodiments of the current invention, a method of reading out the state of a qubit includes providing a qubit device as described above. The method may further include grounding the qubit device. The method may include applying a current across the leads of the qubit device and measuring a voltage change across the leads of the qubit device, where the voltage change may differ depending on which of the two basis states the qubit is in. The method may include storing the measured voltage change or storing a qubit value corresponding to the measured voltage change in a memory. The qubit value may be a voltage, a 0 or a 1, or some other parameter that represents the basis state of the qubit, which is not directly measured in this example.

In some embodiments, a method of grounding a qubit includes providing a qubit device as described above. The method may further include connecting the mesoscopic island of the qubit device to a ground.

In some embodiments, a method of grounding a qubit device includes providing a qubit device as described above. The method may further include driving a current across the leads of the qubit device.

In some embodiments of the invention, a method for initializing the state of a quantum register may include initializing the state of each qubit in the register. The method may further include grounding all of the qubits in the quantum register. The method may further include driving a current across the leads of each of the qubit devices, in parallel or in series.

In some embodiments of the invention, a method for applying quantum gates using the quantum register may include performing bias operations or entanglement operations on one or more qubits in parallel or in series.

In some embodiments of the invention, a method for reading out the state of a quantum register may include performing a readout operation on each of the qubits in the quantum register in parallel or in series.

These and other embodiments are further described below with respect to the following figures.

DETAILED DESCRIPTION

Figure 1:
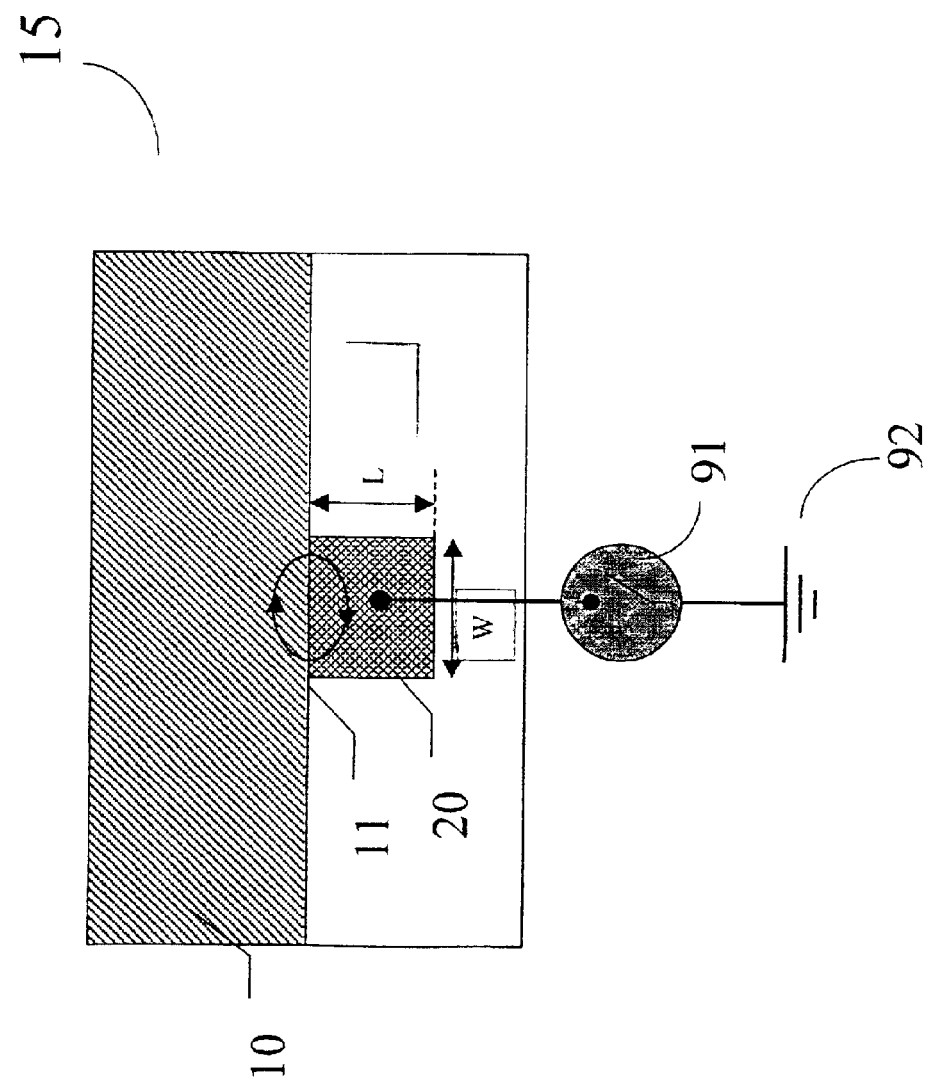
FIG. 1 illustrates a plan view of a Permanent Readout Superconducting Qubit (PRSQ) device.

The following is a glossary of terms used in this application. Although these terms are well known in the art of quantum computing, the glossary is provided to facilitate understanding of the application.

Basis states: The states of the quantum mechanical system being used for storing information.

Bias operation: An operation performed on a qubit in a quantum computing system by energetically favouring one basis state of a qubit over the other.

Bi-crystal fabrication: Formed by connecting together two crystals with a predetermined misorientation between them.

Bi-epitaxial fabrication: Formed by providing a seed layer to control the crystal orientation of a layer grown on the seed layer versus off the seed layer.

Bulk superconductor: A region of superconducting material with a size such that the phase of the order parameter is fixed throughout the region.

Coherent superconductor switch: a switch that controllably conducts supercurrent, such that the phase of the supercurrent entering the switch is the same as the phase of the supercurrent leaving the switch; see parity key.

Collapsing the wavefunction: To remove the probabilistic nature of the wavefunction, leaving the quantum system to occupy a single state. This can be accomplished by measuring the system; for example, by grounding a qubit.

Conventional superconductor: a superconducting material where the superconducting order parameter exhibits s-wave symmetry and has a metallic normal state.

Coulomb energy: charging energy $E_c = e^2/2C$ of a single electron for a Josephson junction of a given capacitance (energy gained by placing an additional single electron on a device of a given capacitance).

Critical current: The current above which dynamical processes occur in a Josephson junction. Such dynamical processes result in quasiparticle excitation in the current flow.

D-wave superconductor: a superconducting material where the superconducting order parameter exhibits d-wave pairing symmetry.

Decoherence: Loss of information in a quantum mechanical system caused by interaction with an environment.

Entanglement of quantum states: Non-local coupling of two of more qubits, whereby affecting one qubit affects all qubits it is entangled with.

Entanglement operation: An operation performed in a quantum computing system that entangles the wavefunctions of two or more qubits.

Grain boundary: A boundary separating two regions of material having different crystal lattice orientations.

Heterostructure junction (S/D heterostructure junction): Josephson junction with a conventional superconductor on one side and an unconventional superconductor on the other side. Such a junction can be formed in the plane of the substrate (a-b) or in a plane normal the plane of the substrate (c-axis).

Josephson energy: the energy $E_J$ corresponding to the entrance or exit of one Cooper pair by tunneling through the Josephson junction.

Josephson junction (tunnel junction): a junction between two superconductors, where the superconducting order parameter is suppressed at the junction.

Measurable value: Any physical attribute of a system that can be described by an operator in the system's Hilbert space (such as energy, position or momentum).

Mesoscopic: Between microscopic and macroscopic. A mesoscopic device indicates a device with physical dimension of physically small size such that some phenomena observed on the structure require quantum mechanical explanation. Mesoscopic typically refers to structures on the order of $10^{-6}$ m in extent.

Parity key: A switch that controllably permits the coherent flow of Cooper pairs, while suppressing the flow of quasi-particles; see coherent superconductor switch.

Plasma frequency: the frequency of plasma oscillations in the Josephson junction, which is a function of the Coulomb energy and the Josephson energy.

Quantum computing: computing accomplished using quantum mechanical effects of physical systems that exhibit quantum mechanical behaviour.

Quantum gate: an information transformation gate that can be applied to the quantum information of a quantum computing system; analogous to the classical gates which include AND, OR, gates as well as others.

Quantum register: an array of one or more qubits, capable of storing multiple pieces of quantum information. A quantum register can also manipulate the information in the qubits that it contains.

Qubit: a physical system that is restricted to two or more quantum states for storing information, where information is contained in the quantum state of the system. The quantum states of the qubit can be made degenerate, having equal energy.

Qubit tunneling amplitude: the frequency of tunneling between the basis states of a qubit.

Refocusing techniques: techniques which can be applied to maintain the correct state in the quantum register.

SQUID: a superconducting quantum interference device; usually a loop of superconducting material including one or two Josephson junctions.

Superconducting order parameter: a property of a superconducting material that describes the behaviour of charge carriers in the superconducting material.

Superconducting single electron transistor: A switch that controllably allows the passage of current; where current includes charge carriers both in the superconducting state and not in the superconducting state.

Supercurrent: Flow of the superconducting condensate, which is made up of charged particles formed from pairwise bound electrons, usually called Cooper pairs.

Superposition of states: A quantum mechanical state in which there is a non-zero probability of occupying more than one of the basis states of the quantum mechanical system at a given time.

Time reversal symmetry: a function has time reversal symmetry when the same results are obtained when time runs forward as when time runs backward.

Tunnel matrix operation: An operation performed on a qubit in a quantum computing system controlling the rate of oscillation between basis states of the qubit.

Wavefunction: a probabilistic envelope that describes the quantum mechanical state of a quantum object.

As stated above, when structures are referred to as "superconducting" herein, they are fabricated from a material capable of superconducting and so may superconduct under the correct conditions. For example, the superconducting loop and superconducting finger may be fabricated from a d-wave superconductor and so will superconduct under appropriate physical conditions. For example, the superconducting loop and finger will superconduct at an appropriate temperature, magnetic field, and current. However, the "superconducting loop" will not superconduct under other physical conditions. For example, when the temperature is too high, the superconducting loop will not be in a superconducting state. Additionally, structures such as superconducting SETs and other superconducting switches mentioned herein are capable of superconducting under appropriate physical conditions.

A device in accordance with an embodiment of the invention generally operates at a temperature such that thermal excitations in the superconducting crystal lattice are sufficiently suppressed to perform quantum computation. In some embodiments of the invention, such a temperature can be on the order of 1K or less. In some other embodiments of the invention, such a temperature can be on the order of 50 mK or less. Furthermore, other dissipative sources, such as magnetic fields for example, should be minimized to an extent such that quantum computing can be performed with a minimum of dissipation and decoherence.

A finger-SQUID phase qubit device according to the present invention includes a superconducting loop and a superconducting finger, where the finger extends towards the interior of the loop and includes a Josephson junction. The superconducting loop may have two or more branches. The branches of the superconducting loop further include Josephson junctions, a region in which the order parameter of the superconductor is suppressed, which allow the finger-SQUID qubit device to operate in an optimal regime for controlling the qubit.

For example, a superconducting loop may have two branches. For each of the two branches, the superconducting order parameter has a first orientation in one region and a second orientation in another region. The first orientation may differ from the second orientation, for example, by 45 degrees. Alternately, a non-zero misorientation other than 45 degrees may be used. At the boundary between the two regions, a grain boundary Josephson junction is formed. The superconducting order parameter can undergo a phase change across the Josephson junction. Depending on the geometry of each of the branches and the grain boundary, the Josephson junction in each branch may cause the same phase change in the superconducting ground state or the phase changes may differ among some or all of the Josephson junctions.

The Josephson junction in the finger of the qubit creates a mesoscopic island. The size of the island and the parameters of the Josephson junction are chosen so that the addition of a single unit of superconducting charge (a Cooper pair) to the island can be measured. The basis states of the qubit are determined in the following manner: if the order parameter in a first region of the loop, from which the finger extends, has a phase of $\Phi$, a phase $\Phi \pm \Delta\Phi$ is accumulated in the order parameter across the Josephson junction in the finger, the sign of which depends on the direction of circulation of the ground state supercurrent at the Josephson junction. Therefore, the qubit can be said to have two bistable phase states, corresponding to the change in phase $+\Delta\Phi$ or $-\Delta\Phi$ of the order parameter across the Josephson junction in the finger. The portion of the qubit device including the first region in the loop from which the finger extends and the finger can be referred to as the qubit.

Therefore, the bistable ground states of the device in the region of the finger near the Josephson junction which separates the mesoscopic island from the rest of the finger, can be used as the basis states of a qubit for quantum computation. Additionally, the two bi-stable phase states forming the basis states of the qubit can be referred to as the $|+\Delta\Phi\rangle$ and $|-\Delta\Phi\rangle$ states, with qubit values corresponding to the phase difference values of $+\Delta\Phi$ and $-\Delta\Phi$ respectively. The basis states of the qubit may, alternatively, be referred to as the $|1\rangle$ and $|0\rangle$ states. Then $|+\Delta\Phi\rangle$ may be designated as either the $|1\rangle$ state or the $|0\rangle$ state, and $|-\Delta\Phi\rangle$ may then be designated as the opposite state.

As stated previously, although the measurable values of the qubit phase change are equal to $+\Delta\Phi$ or $-\Delta\Phi$, in a quantum computing device the qubit phase change is generally not directly measured. Instead, a current may be provided through a qubit device and a resulting voltage across the qubit device will be measured. The measured voltage will depend on which basis state the qubit occupies. That is, the measured voltage will be different if the qubit is in the basis state corresponding to a measurable value of the qubit phase change of $+\Delta\Phi$ than if the qubit is in the basis state corresponding to a measurable value of the qubit phase change of $-\Delta\Phi$.

The basis states of the qubit, $|+\Delta\Phi\rangle$ and $|-\Delta\Phi\rangle$, correspond to two measurable values for the qubit phase change. During a quantum calculation, the qubit state may not correspond to either of the basis states but instead may be a superposition of the two basis states. However, measurement of the state of the qubit will collapse the qubit state wavefunction to a single basis state.

The material of the finger-SQUID phase qubit may be any superconducting material that violates time reversal symmetry. The d-wave superconductor $YBa_2Cu_3O_{7-x}$, where $x$ is between 0 and 0.6, is an example of a useful superconducting material. Additionally, $Bi_2Sr_2Ca_{n-1}CuO_{2n+4}$, $Tl_2Ba_2CuO_{6+x}$, and $HgBa_2CuO_4$ may be used. Materials useful for the substrate include sapphire or $SrTiO_3$ (strontium titanate). The substrate can be bi-crystal, thus facilitating the formation of a grain boundary upon deposition of a superconducting layer, or the substrate can be formed using bi-epitaxial fabrication methods. Methods for forming bi-epitaxial grain boundary junctions are well known and described in the art. See, e.g., S. Nicolleti, H. Moriceau, J. Villegier, D. Chateigner, B. Bourgeaux, C. Cabanel, and J. Laval, "Bi-epitaxial YBCO grain boundary Josephson junctions on $SrTiO_3$ and sapphire substrates", Physica C, 269, 255 (1996), and the references therein, which is herein incorporated by reference in its entirety.

One implementation of a flux qubit involves a micrometer-sized loop with three (or four) Josephson junctions. See J. E. Mooij, T. P. Orlando, L. Levitov, L. Tian, C. H. van der Wal, and S. Lloyd, "Josephson Persistent-Current Qubit," Science 285, 1036 (1999) and references therein, which is herein incorporated by reference in its entirety. The energy levels of this system correspond to differing amounts of magnetic flux threading the loop. Application of a static magnetic field normal to the loop may bring two of these energy levels (or basis states) into degeneracy. Typically, external AC electromagnetic fields are also applied, to enable tunneling between non-degenerate states.

A radio-frequency superconducting quantum-interference device (rf-SQUID) qubit is another type of phase qubit having a state that can be read by inductively coupling the rf-SQUID to rapid single-flux-quantum (RSFQ) circuitry. See R. C. Rey-de-Castro, M. F. Bocko, A. M. Herr, C. A. Mancini, and M. J. Feldman, "Design of an RSFQ Control Circuit to Observe MQC on an rf-SQUID," IEEE Trans. Appl. Supercond. 1, 1014 (2001) and references therein, which is hereby incorporated by reference in its entirety. A timer controls the readout circuitry and triggers the entire process with a single input pulse, producing an output pulse only for one of the two possible final qubit states. The risk of this readout method lies in the inductive coupling with the environment causing decoherence or disturbance of the qubit state during quantum evolution. The circuitry attempts to reduce decoherence by isolating the qubit with intermediate inductive loops. Although this may be effective, the overhead is large, and the method becomes clumsy for large numbers of qubits.

In both above systems, an additional problem is the use of basis states that are not naturally degenerate. Accordingly, the strength of the biasing field for each qubit has to be precisely controlled to achieve the desired tunneling between its basis states. This is possible for one qubit, but becomes extremely difficult with several qubits. The finger-SQUID phase qubit such as that shown in FIG. 2, provides naturally degenerate basis states for quantum computation, and thus combines benefits of existing qubit designs.

A permanent readout superconducting qubit (PRSQ) design was first disclosed by Alexandre Zagoskin, U.S. patent application Ser. No. 09/452,749, "Permanent Readout Superconducting Qubit", filed Dec. 1, 1999, which is herein included by reference in its entirety. An embodiment of a PRSQ 15 is shown in FIG. 1. PRSQ 15 can include a bulk superconductor 10, a grain boundary 11, and a mesoscopic island 20 (i.e., an island that has a size such that a single excess Cooper pair is measurable). PRSQ 15 can also include a switch 91, which may be connected to a ground 92. Switch 91 can be a coherent superconducting switch such as a superconducting SET or a parity key. The material utilized in fabricating PRSQ 15 can be a high-$T_c$ superconductor having a pairing symmetry that contains a dominant component with non-zero angular moment, and a sub-dominant component that can have any pairing symmetry. The resulting qubit has the basis states $\pm\Delta\Phi$ with respect to the phase, $\Phi$, of the bulk superconductor. Another advantage of the PRSQ device is the highly localized phase states at the Josephson junction separating the mesoscopic island from the bulk. Although the PRSQ provides a robust system for quantum computation, realization of fundamental quantum gate operations requires direct interaction with the phase of the device. Direct interaction with the state of the qubit can result in decohering processes that require more sophisticated techniques for protecting the state of the qubit.

In accordance with the present invention, a finger-SQUID phase qubit device provides highly localized and naturally degenerate qubit basis states, and a system for applying fundamental quantum computing operations without a necessity for direct interaction with the state of the qubit device.

Figure 2:
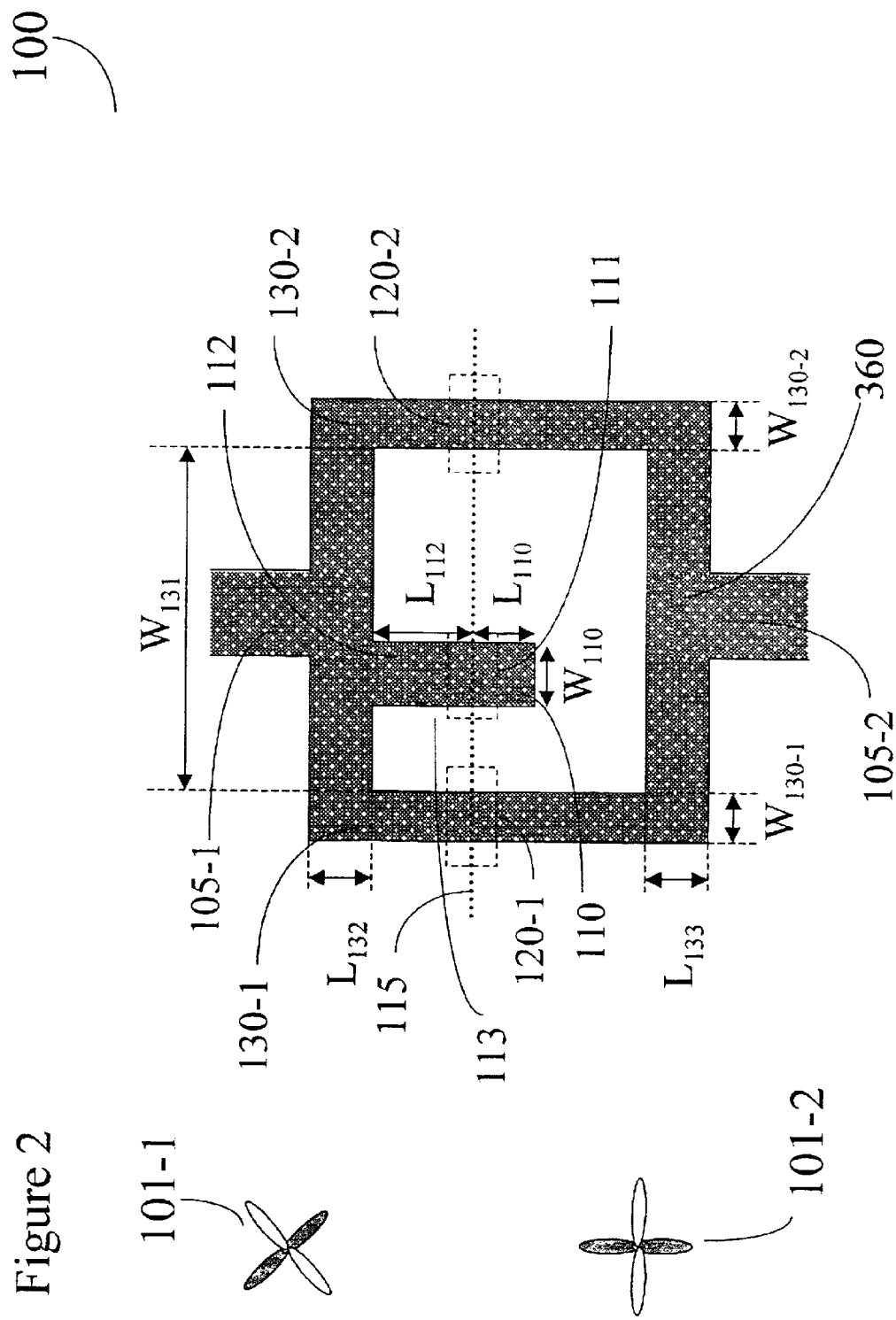
FIG. 2 illustrates a plan view of an embodiment of a finger SQUID qubit device according to the present invention.

FIG. 2 illustrates an embodiment of the finger-SQUID phase qubit device according to the present invention. A qubit device 100 includes a superconducting loop 360. Superconducting loop 360 has branches 130-1 and 130-2. Device 100 further includes a superconducting finger 112, which includes a superconducting island 110. Leads 105-1 and 105-2 can couple qubit device 100 to external circuitry that controls qubit device 100. FIG. 2 illustrates a grain boundary 115 crossing branches 130-1 and 130-2 and finger 112 of device 100. Junctions 120-1 and 120-2, which are formed where grain boundary 115 crosses branches 130-1 and 130-2, respectively, can control the behaviour of the device 100, while junction 111, which is formed where grain boundary 115 crosses finger 112, can be formed to control operation parameters of a qubit 113 such as the tunneling amplitude.

The change in phase of the order parameter across Josephson junction 111 in finger 112 forms the basis states for information in qubit device 100. If the order parameter has a phase of Φ where finger 112 extends from loop 360, the order parameter has a change in phase of ±ΔΦ across Josephson junction 111, depending on the direction of circulation of the ground state supercurrent. Therefore, the region of qubit device 100 including finger 112 and the region where finger 112 extends from loop 360 can then be referred to as qubit 113.

Finger 112 (including island 110) of device 100 can be asymmetric with respect to branches 130-1 and 130-2 of loop 360 of device 100, as shown in FIG. 2. By forming finger 112 asymmetrically with respect to branches 130-1 and 130-2 of loop 360, coupling between the flux in loop 360 and finger 112 can be minimized. In some embodiments of the invention, finger 112 can be symmetric with respect to branches 130-1 and 130-2 and leads 105-1 and 105-2 of device 100. The position of finger 112 in device 100 with respect to leads 105-1 and 105-2 and branches 130-1 and 130-2 will vary the effect of current through leads 105-1 and 105-2 on superconducting island 110, and correspondingly, on the ground state phase of qubit 113.

The angle of crystal orientation of superconducting material is related to the orientation of the superconducting order parameter. In FIG. 2, superconducting order parameter 101-1 is related to the angle of crystal orientation of device 100 on the side of grain boundary 115 towards lead 105-1. Similarly, superconducting order parameter 101-2 is related to the angle of crystal orientation of device 100 on the side of grain boundary 115 towards lead 105-2. The angle of mismatch between the superconductor crystal lattice orientation on either side of grain boundary 115 can vary with respect to the orientation of grain boundary 115 for different embodiments of the invention. When junction 111 is a grain boundary Josephson junction, the angle of misorientation of the superconductor crystal lattice above and below grain boundary 115 can determine the ground state of qubit 113. The angle of orientation can be chosen to control the operation of the qubit device 100. Note that in this context, the term "superconductor crystal lattice" refers to the crystal lattice of the material that comprises parts of qubit device 100 (e.g. superconducting loop 360 and superconducting finger 112) and is superconducting during device operation. However, it is not superconducting under all conditions (e.g. it will be in the normal state if the temperature, magnetic field, or current is too high). Further, the superconducting order parameter may be suppressed in Josephson junctions 120-1, 120-2, and 111 of qubit device 100.

In some embodiments of the invention, superconducting order parameter 101-1 is misoriented with respect to superconducting order parameter 101-2. For example, superconducting order parameter 101-1 can be oriented at an angle of about 45 degrees with respect to the orientation of superconducting order parameter 101-2. Other embodiments may use other non-zero misorientations.

Further, for at least one of the Josephson junctions 120-1, 120-2, and 111 of qubit device 100, the superconductor crystal lattice may have about a 45° misorientation angle with respect to the orientation of grain boundary 115, such that a ground state π/2 phase shift is induced in transition across the Josephson junction.

FIG. 2 illustrates some dimensions of an embodiment of the invention. In this embodiment, the width of island 110, $W_{110}$, can range between roughly 0.1 μm and roughly 0.5 μm and the length of the island $L_{110}$ can range between roughly 0.5 μm and roughly 1 μm. The portion of finger 112 not including island 110 can have a length $L_{112}$ less than roughly 2 μm. Superconducting loop 360 can have a width $W_{131}$ ranging between roughly 0.5 μm and roughly 5 μm. The length of the region of loop 360 that finger 112 extends from, $L_{132}$, can range between roughly 0.5 μm and roughly 2 μm, and the length of the opposite region in the superconducting loop, $L_{133}$, can have the same range. In some embodiments of the invention, the lengths $L_{132}$ and $L_{133}$ can be different. The width of branch 130-1, $W_{130-1}$, can range between roughly 0.2 μm and roughly 2 μm, and the width of branch 130-2, $W_{130-2}$, can have a similar range. In some embodiments of the invention, widths $W_{130-1}$ and $W_{130-2}$ can be different. In an embodiment of the invention, Josephson junction 111 of FIG. 2 can have a capacitance C of about $10^{-14}$ F, and a corresponding Coulomb energy $E_c$ of about 20 GHz. Junction 111 can have a critical current $I_c$ of about 100 nA, and a corresponding Josephson energy $E_J$ of about 300 GHz. The plasma frequency $\omega_P$ can be about 25 GHz, and the phase difference across junction 111, ΔΦ, can be about 0.2π.

Figure 3A:
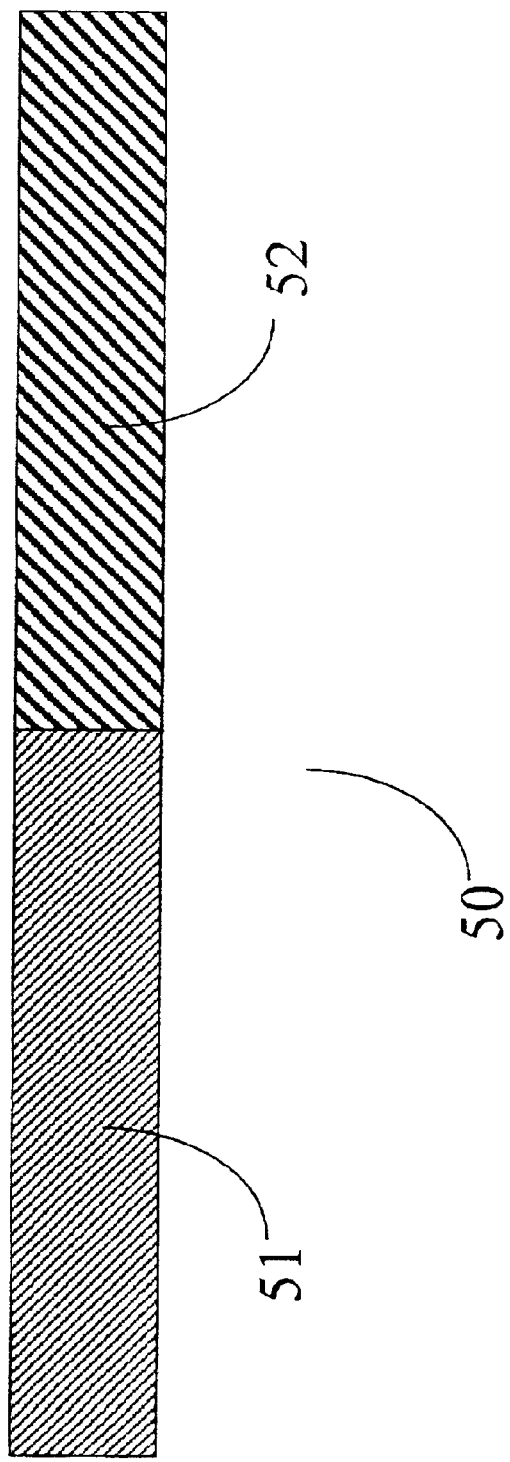
FIGS. 3A through 3D illustrate a method of fabricating a finger SQUID qubit device.
Figure 3B:
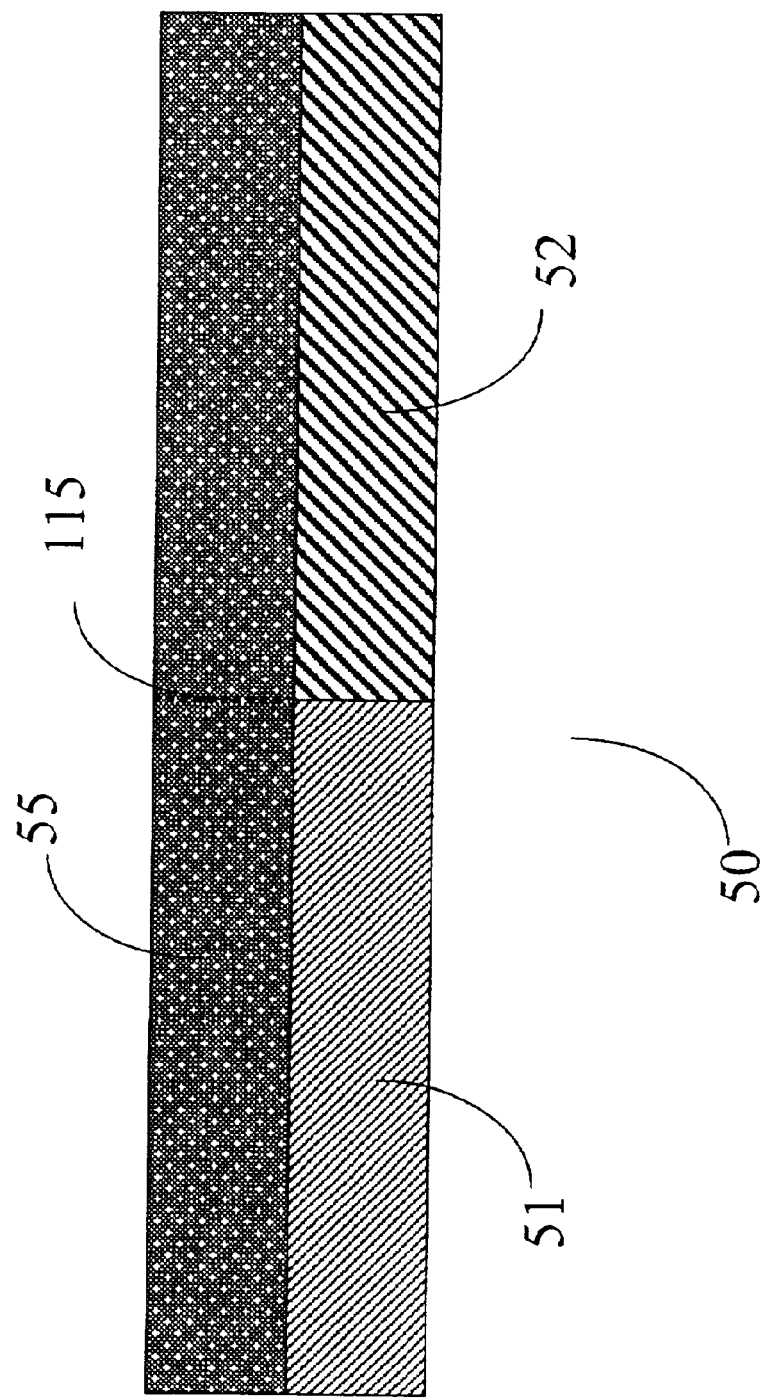

FIGS. 3A to 3D illustrate an embodiment of a method for fabricating a finger-SQUID qubit device. For example, substrate 50 of FIG. 3A can be a bi-crystal substrate or a bi-epitaxial substrate. First region 51 of substrate 50 has a first crystal lattice orientation, while second region 52 of substrate 50 has a second crystal lattice orientation. Superconducting material 55 is deposited on substrate 50, as shown in FIG. 3B. The crystal lattice orientation of superconducting material 55 aligns with the crystal lattice orientation of the underlying substrate 50. Therefore, superconducting material 55 deposited on first region 51 of substrate 50 has a crystal lattice orientation aligned with the first crystal lattice orientation, while superconducting material 55 deposited on second region 52 of substrate 50 has a crystal lattice orientation aligned with the second crystal lattice orientation. As a result, grain boundary 115 can be formed between the regions of superconducting material 55 having different crystal lattice orientations.

Figure 3C:
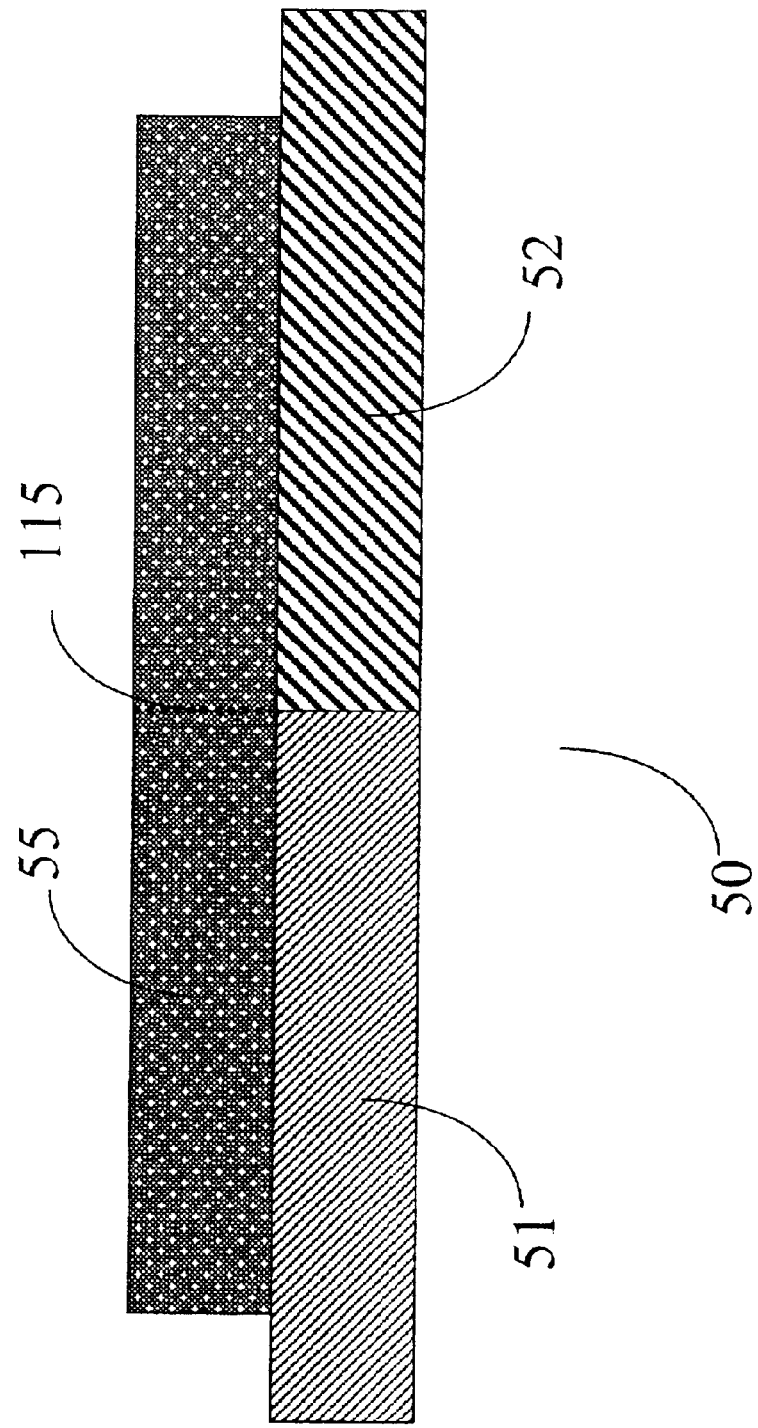
Figure 3D:
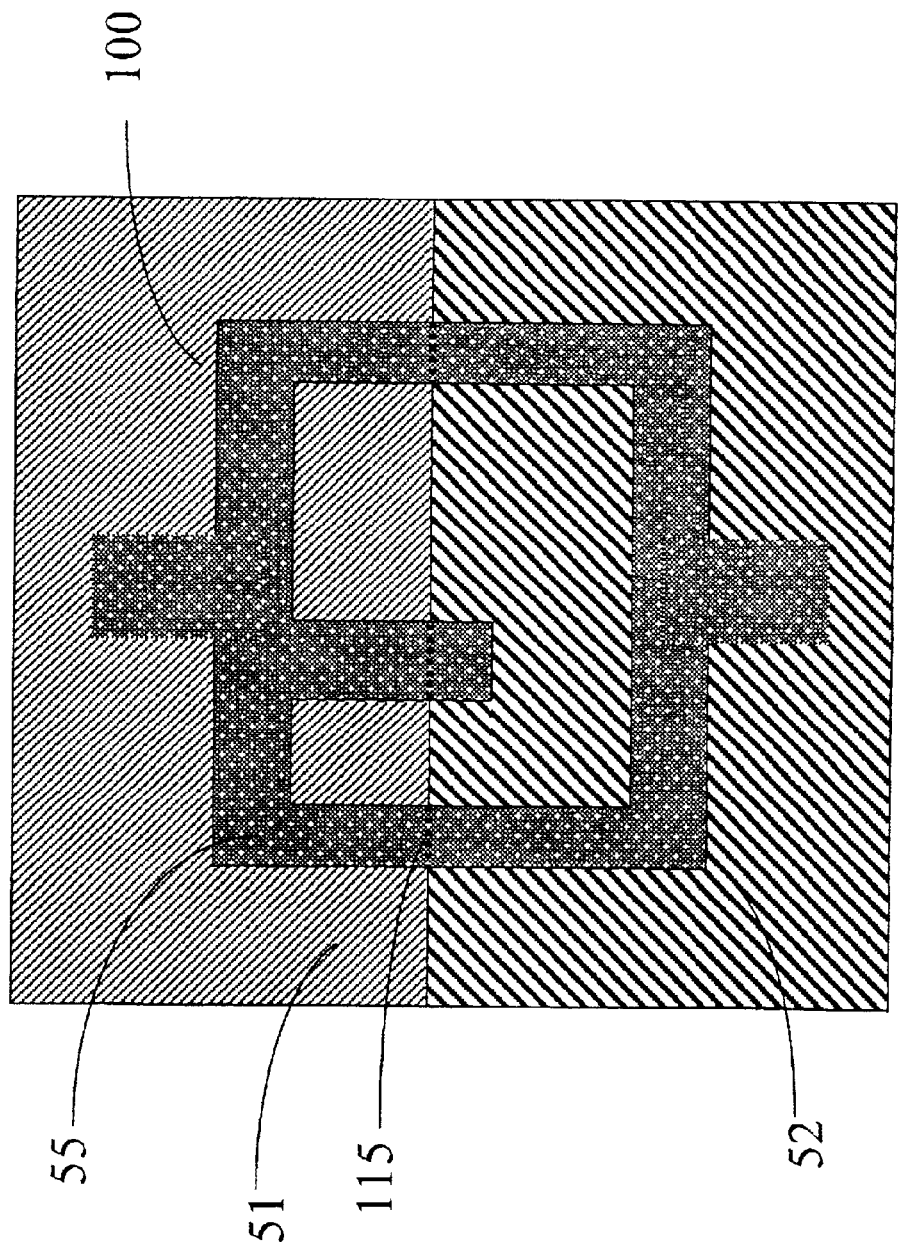

Superconducting material 55 can be patterned according to well-known methods, as shown in FIG. 3C (side view) and FIG. 3D (top view). The formation and behaviour of grain boundary Josephson junctions is well known and described in the art. See, e.g., E. Il'ichev, M. Grajcar, R. Hlubina, R. Ijsselsteijn, H. Hoenig, H. Meyer, A. Golubov, M. Amin, A. Zagoskin, A. Omelyanchouk, and M. Kupriyanov, "Degenerate Ground State in a Mesoscopic $YBa_2Cu_3O_{7-x}$ Grain Boundary Josephson Junction", Phys. Rev. Letters, 86, 5369 (June 2001), and the references therein, each of which is incorporated by reference in its entirety.

Referring again to FIG. 2, the ground state phase difference across junctions 120-1 and 120-2 can depend on the orientation of the branch with respect to the grain boundary. Thus the junctions 120-1 and 120-2 can have a ground state phase difference chosen to tune interaction of the device with the surrounding environment. The order parameters 101-1 and 101-2 are related to the crystal lattice orientations of the superconductor and the underlying substrate. In order to form a grain boundary junction, where order parameters 101-1 and 101-2 are suppressed at the grain boundary, a bi-crystal substrate or a bi-epitaxial substrate may be used. Methods for fabricating grain boundary junctions using bi-crystal fabrication methods and bi-epitaxial fabrication methods are well known.

An embodiment of the invention can include a bi-epitaxial substrate, and an array of finger SQUID qubit devices, fabricated so that the superconducting loop and the superconducting finger cross the grain boundary of the substrate. The finger SQUID qubit devices are patterned using a superconducting material that violates time reversal symmetry. Materials that are useful as a substrate include sapphire or strontium titanate, for example. The devices can be patterned using an unconventional superconductor material such as a d-wave superconductor. An example of a d-wave superconductor is $YBa_2Cu_3O_{7-x}$, where x is between 0 and 0.6. Additional examples include $Bi_2Sr_2Ca_{n-1}Cu_nCO_{2n+4}$, $Tl_2Ba_2CuO_{6+x}$, and $HgBa_2CuO_4$. The angle of misorientation of the superconductor crystal lattice with respect to the grain boundary can be chosen to optimize the characteristics of the device. The superconductor crystal lattice orientation can have a 0°–45° change with respect to the orientation of the grain boundary. That is, the superconductor crystal lattice on one side of the grain boundary may be aligned with the direction of the grain boundary, while the superconductor crystal lattice on the other side of the grain boundary may be aligned at about a 45° angle with the direction of the grain boundary.

Figure 4:
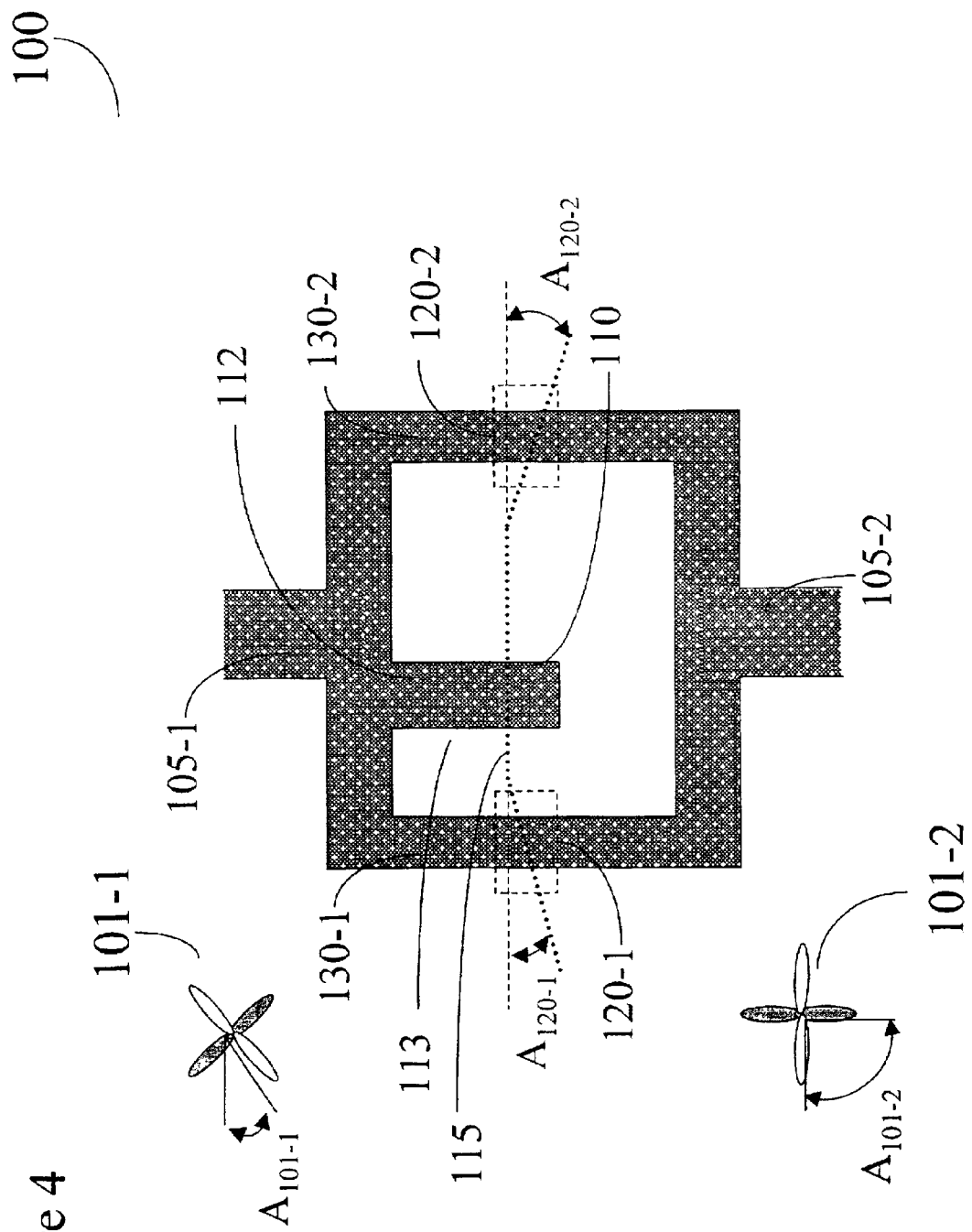
FIG. 4 illustrates a plan view of another embodiment of a finger SQUID qubit device according to the present invention.

FIG. 4 illustrates an embodiment of the invention wherein the ground state phase difference across Josephson junctions 120-1 and 120-2 can be controlled. As FIG. 4 shows, the orientation of grain boundary 115 may change across device 100. Changing the angle of misorientation across the grain boundary can modify the critical current of junction 111, thus providing control over the tunneling amplitude of qubit 113.

Grain boundary 115 is formed by forming a misorientation in the crystal lattice of the superconducting material. That is, the crystal lattice of the superconducting material on the side of grain boundary 115 towards lead 105-1 is misoriented with respect to the crystal lattice of the superconducting material on the opposite side of grain boundary 115. Order parameter 101-1 and order parameter 101-2, which correlate with the crystal lattice orientation of the superconductor, take on angles $A_{101-1}$ and $A_{101-2}$ respectively. The angle of misorientation across the grain boundary $A_{101-1}$–$A_{101-2}$ correlates with phase difference of the grain boundary Josephson junction. Angles $A_{120-1}$ and $A_{120-2}$ can be varied to further control the phase difference of Josephson junctions 120-1 and 120-2. Angles $A_{120-1}$ and $A_{120-2}$ are chosen to optimize the operational parameters of superconducting loop 360 of device 100. An embodiment of the invention can make use of angles $A_{101-1}$, $A_{101-2}$, $A_{120-1}$, and $A_{120-2}$ to control the phase difference across junctions 120-1 and 120-2, respectively, and consequently the device control over the qubit characteristics.

The phase difference across junctions 120-1, 120-2, and 111 may be different for each junction or may be the same for some or all of the junctions. For example, in a particular embodiment of the invention, the superconductor crystal lattice has a 0°–45° misorientation with respect to grain boundary 115. That is, the superconductor crystal lattice on one side of grain boundary 115 may be aligned with the direction of the grain boundary, while the superconductor crystal lattice on the other side of grain boundary 115 may be aligned at about a 45° angle with the direction of the grain boundary. Josephson junctions 120-1 and 120-2 can have different orientation angles $A_{120-1}$ and $A_{120-2}$. For example, junction 120-1 can have an angle $A_{120-1}$ of 0°, and junction 120-2 can have an angle $A_{120-2}$ of about 22.5°. In this embodiment, junctions 120-1 and 111 are π/2-phase shift Josephson junctions, while junction 120-2 is a 0-phase shift Josephson junction. In another embodiment of the invention, junctions 120-1 and 120-2 can have angles $A_{120-1}=A_{120-2}=0°$ respectively.

Behaviour of symmetric and asymmetric SQUIDS has been described in U.S. patent application Ser. No. 09/823, 895, M. Amin, T. Duty, A. Omelyanchouk, G. Rose, A. Zagoskin, and J. Hilton, "High Sensitivity, Directional DC-SQUID Magnetometer", filed Mar. 31, 2001, and herein incorporated by reference in its entirety; and I. Borisenko, P. Mozhaev, G. Ovsyannikov, and K. Constantinian, "Superconducting Current-Phase Dependence in High-$T_c$ Symmetrical Bicrystal Junctions", SQUID 2001 conference proceedings (Sep. 2, 2001), and the references therein, herein incorporated by reference in its entirety.

Referring again to FIG. 4, superconducting island 110 should be mesoscopic in size, such that it is sensitive to the presence or absence of a single Cooper pair. The capacitance of superconducting island 110 is related to the width of the Josephson junction 111; therefore, the tunneling amplitude of qubit 113 depends in part on the width of island 110. Modifying the angle of branches 130-1 and 130-2, or the angle of the grain boundary (as illustrated by angles $A_{120-1}$ and $A_{120-2}$), can change the ground state phase difference across junctions 120-1 and 120-2 respectively. Thus, the crystal lattice misorientation angle should be chosen to optimize the operational parameters of the island 110 of the device.

Figure 5:
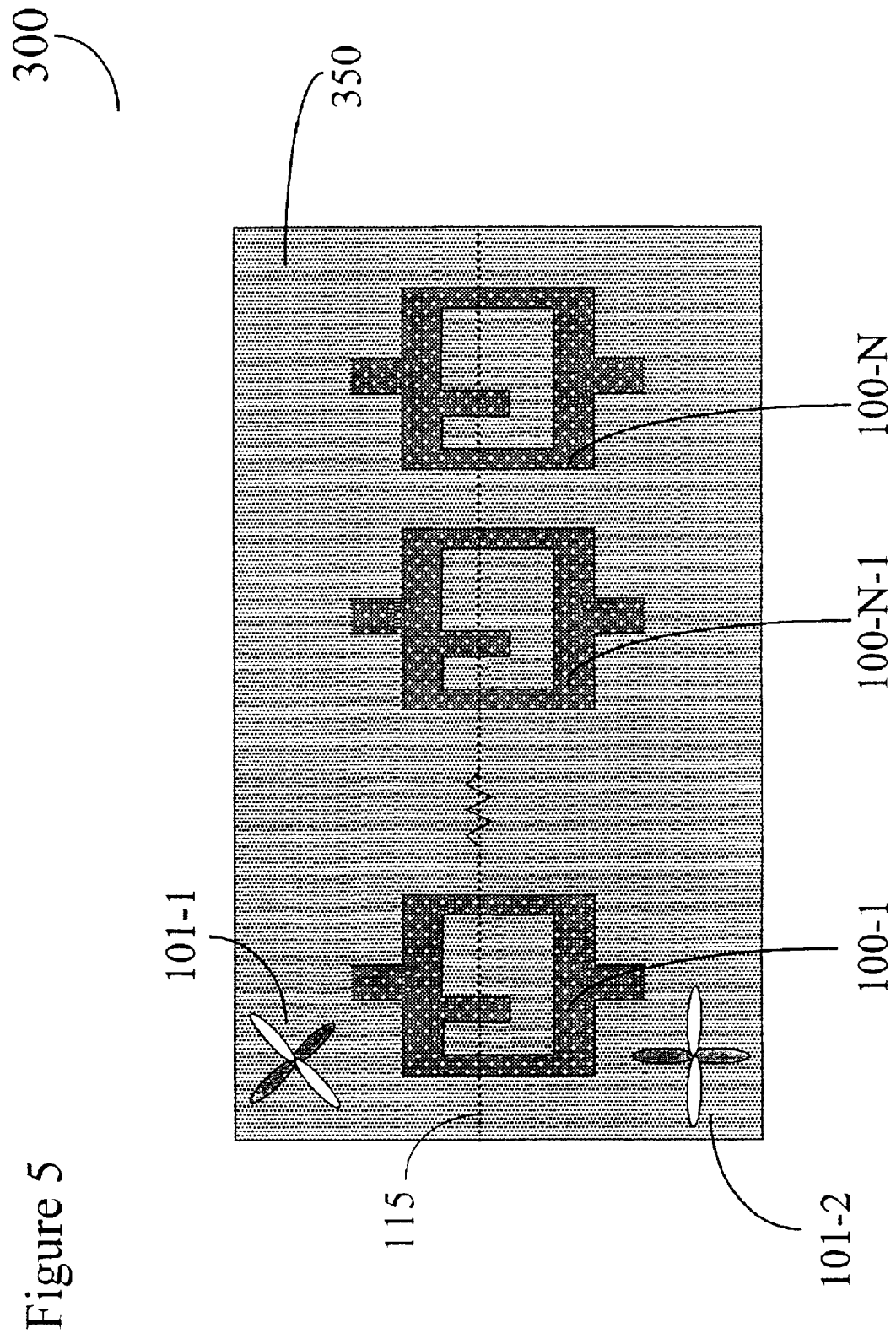
FIG. 5 illustrates a plan view of a quantum register in accordance with some embodiments of the invention.

FIG. 5 illustrates an embodiment of a quantum register 300. Quantum register 300 includes an array of N finger SQUID qubit devices 100-1 through 100-N. The illustrated substrate region 350 can be a bi-epitaxial substrate such that the orientation of the crystal lattice can change across grain boundary 115. The orientation of the order parameters 101-1 and 101-2 of the superconducting material are related to the crystal lattice orientation of the substrate. The superconducting material can have an angle of misorientation in the order parameter, with respect to the grain boundary, such that the operational parameters of the device can be optimized.

In order to perform quantum computation, a quantum register such as quantum register 300 in FIG. 5 provides a universal set of basic quantum operations, such that any quantum gate can be implemented. In some cases, the universal set can include a $\hat{\sigma}_x$ or tunnel matrix operation, a $\hat{\sigma}_z$ or bias operation, and an entanglement operation. In quantum register 300, the $\hat{\sigma}_x$ matrix is correlated the tunneling amplitude of the qubit for each qubit device 100-1 through 100-N. The operators $\hat{\sigma}_x$ and $\hat{\sigma}_z$ are the well known Pauli matrices, which for a doubly degenerate system can be represented as shown in Equations 1 and 2.

$$\hat{\sigma}_x = \begin{pmatrix} 0 & 1 \\ 1 & 0 \end{pmatrix} \qquad \text{Equation 1}$$

$$\hat{\sigma}_z = \begin{pmatrix} 1 & 0 \\ 0 & -1 \end{pmatrix} \qquad \text{Equation 2}$$

Control of the tunneling matrix operation or $\hat{\sigma}_x$ is not necessary as long as the tunneling is effectively suppressed while the other operations are applied. For example, the other operations can be controlled with a time constant $\tau_c$, such that $\tau_c \leqq \Delta^{-1}$, where $\Delta$ is the tunneling amplitude of the qubit. Furthermore, if the other quantum gates require a time $\tau_c \geqq \Delta^{-1}$, refocusing techniques can be applied to maintain the correct state in the quantum register. Refocusing techniques are well known in the art and described in D. Lidar, and L. Wu, "Reducing Constraints on Quantum Computer Design by Encoding Selective Recoupling," LANL quant-ph/0109021, September, 2001, which is herein incorporated in its entirety. The entanglement operation needs to entangle the quantum states of selected qubits in the quantum register in order to implement many crucial quantum algorithms. See, e.g., U.S. Pat. No. 5,768,297, Peter Shor, "Method for reducing decoherence in quantum computer memory", filed October 1996, and the references therein, each of which is hereby incorporated by reference in its entirety. In an embodiment of the invention, an entanglement operation can be a controlled phase shift CP. Controlled phase shift operations are well known and described by the Pauli matrix of equation 3.

$$CP = \begin{pmatrix} 1 & 0 & 0 & 0 \\ 0 & -1 & 0 & 0 \\ 0 & 0 & -1 & 0 \\ 0 & 0 & 0 & 1 \end{pmatrix} \quad \text{Equation 3}$$

Figure 6:
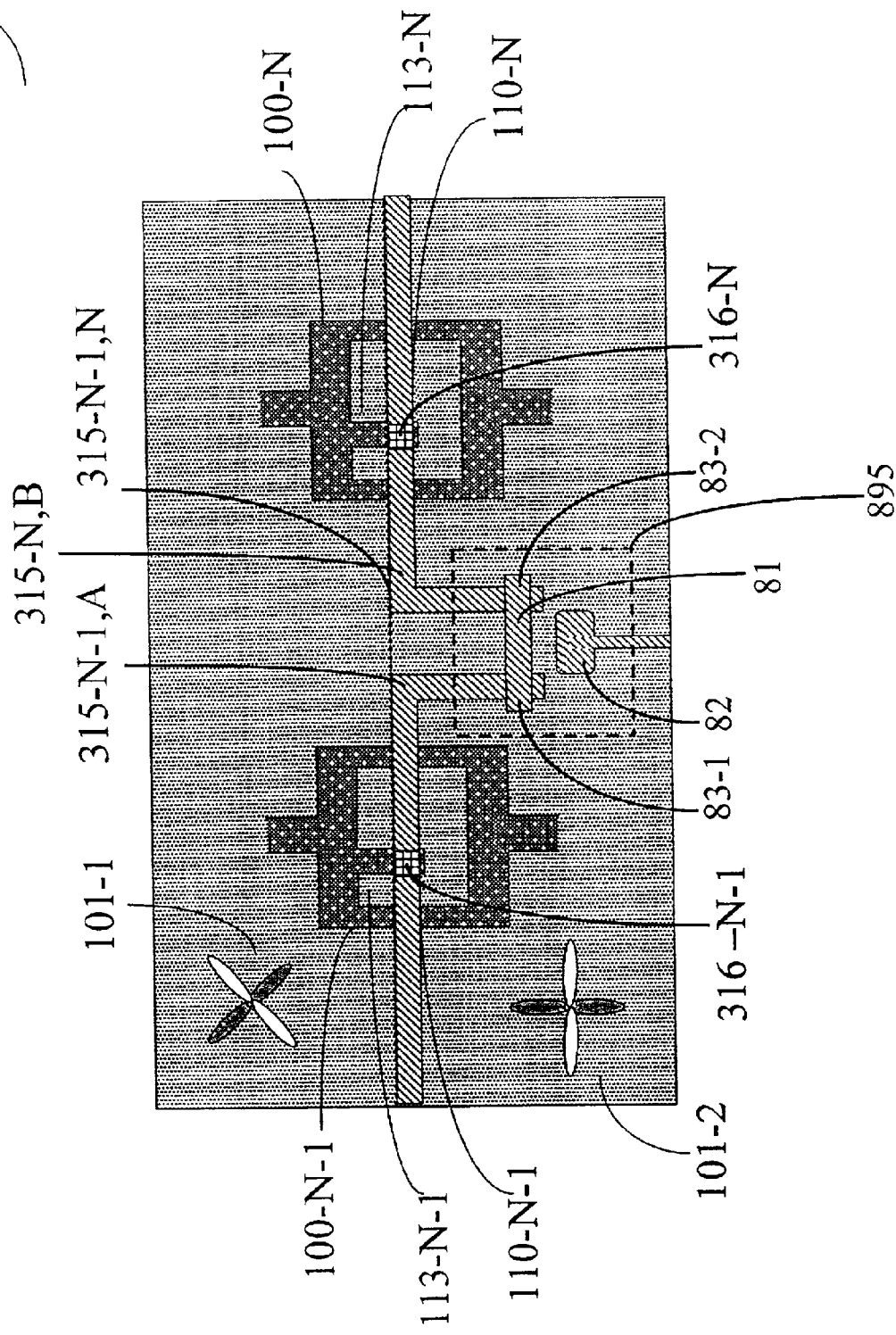
FIG. 6 illustrates a plan view of a control system coupled to a quantum register such as that shown in FIG. 5.

Referring to FIG. 6, an embodiment of the invention includes a mechanism for coupling qubits 113-N-1 and 113-N in a quantum register 300 of M finger SQUID qubit devices 100-1 through 100-M. Finger SQUID qubit devices 100-N-1 and 100-N in quantum register 300 can be coupled to perform an entanglement operation; that is, when the wavefunctions of the respective qubits are allowed to overlap. A mechanism for providing an entanglement operation between qubits includes a coherent, superconducting coupling link 315-N-1,N between the superconducting islands 110-N-1 and 110-N. The superconducting coupling link 315-N-1, N of this embodiment provides a mechanism for supercurrent to flow coherently between qubits 113-N-1 and 113-N of qubit devices 100-N-1 and 100-N, thus entangling the states of the qubits. The superconducting coupling link can further provide a coupling switch 895 to open or close the coupling link between the qubits. Coupling switch 895 may be a coherent supercurrent switch such as a parity key or coherent SET (single electron transistor) device.

FIG. 6 illustrates a quantum register 300 formed from an array of finger SQUID qubit devices 100-1 through 100-M, wherein a mechanism for entangling the state of qubits is illustrated. Superconducting link 315-N-1,N provides a coherent connection between qubit devices 100-N-1 and 100-N when coupling switch 895 is closed. Interface junctions 316-N-1 and 316-N provide coherent connections between qubit devices 100-N-1 and 100-N respectively. Junctions useful for forming the interface junctions 316-N-1 and 316-N include coherent heterostructure junctions. Coherent heterostructure junctions provide a coherent transition between an unconventional superconducting material and a conventional superconducting material.

A method for fabricating superconducting link 315-N-1,N and heterostructure junctions 316-N-1 and 316-N includes depositing an insulating material over an array of finger SQUID qubit devices, etching and developing regions of the insulating material to expose the underlying superconducting islands 110-N-1 and 100-N, depositing a conductive material over the entire chip, etching and developing the conductive material such that it remains only in the exposed superconductor areas, depositing a superconducting material over the entire chip, and etching and developing the superconductor material to pattern connections between the underlying exposed qubit devices. The result of such a fabrication process is an array of coupled qubits, all of which are coupled through heterostructure junctions such as junction 316-N and 316-N-1. Furthermore, heterostructure junctions 316-N and 316-N-1 provide a means for coupling two different types of superconductor together. Superconducting link 315-N-1, N can be a conventional superconducting material such as niobium (Nb), aluminum (Al), or lead (Pb). Methods for fabricating coherent SET devices or parity keys using conventional superconductors such as Nb or Al are well known in the art. Heterostructure junctions such as heterostructure junctions 316-N and 316-N-1 and their preparation are described in previously filed patent application, filed on Dec. 6, 2001, entitled "Trilayer Heterostructure Junctions," by AlexanderTzalenchuk, Zdravko Ivanov, and Miles F. H. Steininger, which is hereby incorporated by reference in its entirety.

A method of controlling superconducting link 315-N-1,N is provided, such that the states of qubit 113-N-1 and qubit 113-N can be entangled when required. Superconducting link 315-N-1,N includes a first lead 315-N-1, A and a second lead 315-N, B as shown in FIG. 6. Controllable entanglement can be accomplished by introducing a coherent coupling switch 895 in the superconducting link 315-N-1,N such that when the switch is closed, superconducting link 315-N-1,N coherently conducts supercurrent, and when the switch is open, superconducting link 315-N-1,N does not conduct. A mechanism for controllably coupling a qubit 113-N and qubit 113-N-1 includes providing first lead 315-N-1,A from qubit 113-N-1 to coupling switch 895, and providing second lead 315-N,B from qubit 113-N to coupling switch 895. In operation, with coupling switch 895 in the open state, qubits 113-N and 113-N-1 will be de-coupled, whereas, with coupling switch 895 in the closed state, qubits 113-N and 113-N-1 will be coupled.

Coupling switch 895 in FIG. 6 illustrates a superconducting SET device 895. Island 81 is isolated by tunnel junctions 83-1 and 83-2, and a voltage can be capacitively coupled to island 81 using electrode 82. One side of SET 895 connects to first lead 315-N-1,A, while the other side connects to the second lead 315-N-B. The voltage coupled to island 81 using electrode 82 provides a means to tune superconducting island 81 of coupling switch 895, for example the SET device shown here, to allow passage of single electrons or pairs of electrons between the leads 315-N-1,A and 315-N-B.

Island 81 of SET device 895 can have a width corresponding to the width of tunnel junctions 83-1 and 83-2, and a length on the order of about 5 $\mu$m or less. The length of island 81 can be on the order of about 2 $\mu$m or less, or in some embodiments the length of island 81 can be on the order of about 0.5 $\mu$m. Electrode 82 can be formed on the order of about 0.5 $\mu$m from the superconducting island 81. Tunnel junctions 83-1 and 83-2 that separate superconducting island 81 of the device from leads 315-N-1,A and 315-N,B can include a non-superconducting layer between the island 81 and the and the respective lead. Tunnel junctions 83-1 and 83-2 can have small capacitances such that the Josephson energy of the junctions is much less than the Coulomb energy of the device.

Charging electrode 82 can change the ratio of the Coulomb energy to the Josephson energy in the device, thus controlling the flow of current across island 81. The material forming the intermediate layer of tunnel junctions 83-1 and 83-2 can have a dielectric value such that the Josephson energy of the junctions is much less than the Coulomb energy of the device. The thickness of the intermediate layer of tunnel junctions 83-1 and 83-2 is chosen in a regime such that the Josephson energy of the junctions are much less than the Coulomb energy of the device, but not so large as to reduce tunneling effects. Some materials that are useful for forming the intermediate layer of the junctions are aluminum oxide ($Al_2O_3$), or a normal metal such as gold. Preparation of tunnel junctions 83-1 and 83-2 and island 81 can include use of electron-beam lithography, and shadow mask evaporation techniques. Methods for forming tunnel junctions such as tunnel junctions 83-1 and 83-2 are well known as described in the art. The area of the junctions can be on the order of about 0.5 $\mu m^2$ or less. In some embodiments of the invention, the area of said tunnel junctions can be on the order of about 0.1 $\mu m$ or less, and in other embodiments the area of said tunnel junctions can be on the order of about 60 $nm^2$ or less. The behavior of SETs is well defined and is discussed in detail in P Joyez et al., "Observation of Parity-Induced Suppression of Josephson Tunneling in the Superconducting Single Electron Transistor," Physical Review Letters, Vol. 72, No. 15, Apr. 11, 1994, herein incorporated by reference in its entirety, and D. Born, T. Wagner, W. Krech, U. Hubner, and L. Fritzch, "Fabrication of Ultrasmall Tunnel Junctions by Electron Beam Direct-Writing", IEEE Trans. App. Superconductivity, 11, 373 (March 2001), and the references therein, which is herein incorporated in its entirety.

Another mechanism for providing entanglement between qubits includes a superconducting loop between qubit devices 100-N-1 and 100-N. This superconducting loop can have a switch, such that when the switch is open, the superconducting loop cannot inductively couple to the qubits, and when the switch is closed the superconducting loop does inductively couple to the qubits, thus providing a mechanism for controllably entangling the states of the qubits.

Figure 7:
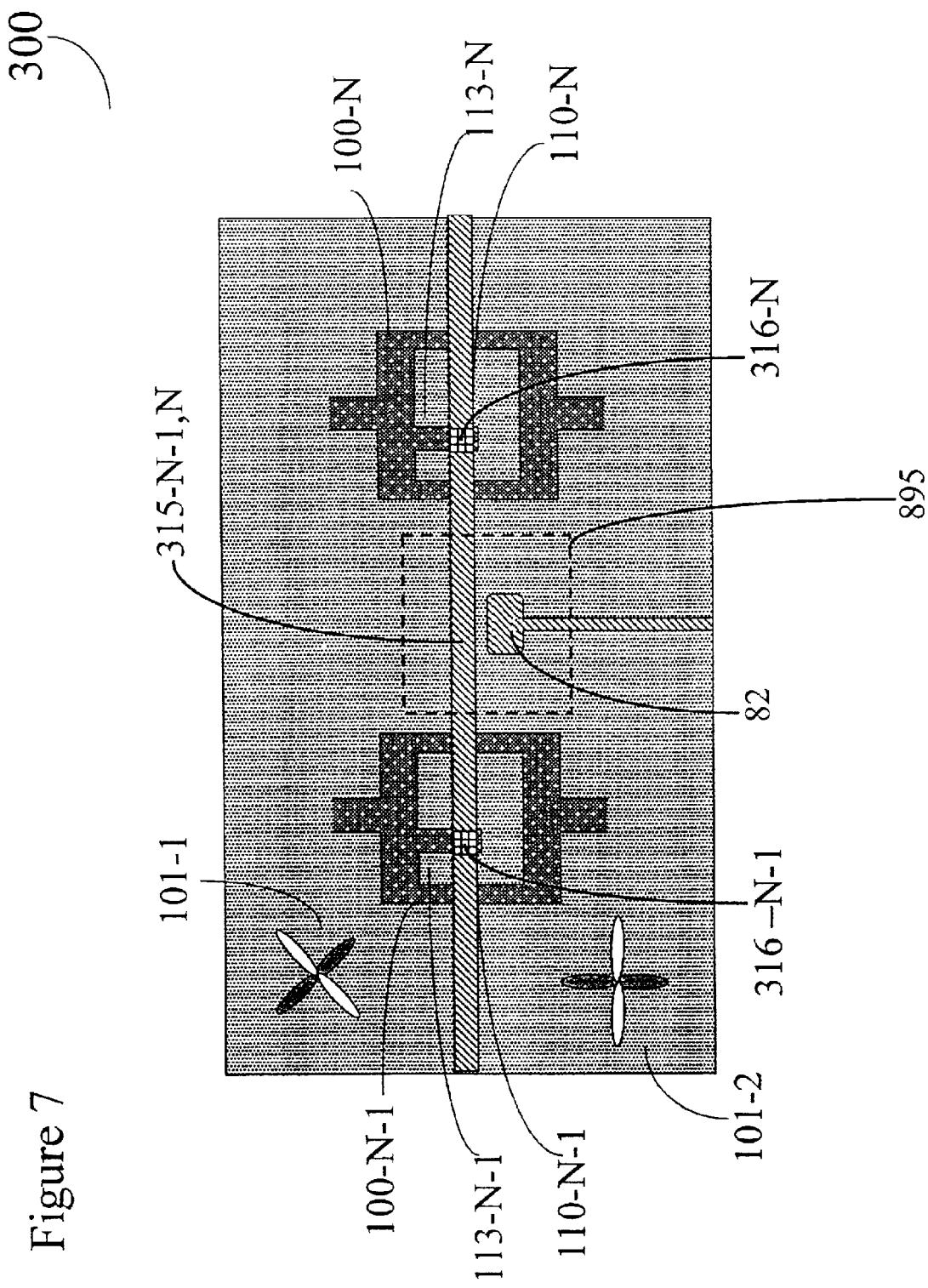
FIG. 7 illustrates a plan view of a plurality of quantum registers in accordance with another embodiment of the invention.

FIG. 7 shows another mechanism for providing entanglement between qubits, which includes providing a direct, coherent link between the respective qubit devices to be coupled, and providing an electrode, wherein the electrode is capacitively coupled to the coherent link. The electrode can provide a mechanism for controlling the charging energy of the coherent link, such that the link permits the flow of supercurrent or prevents the flow of supercurrent.

FIG. 7 illustrates a region of a quantum register 300 in accordance with an embodiment of the invention. Switch 895 may coherently couple qubit devices 100-N-1 and 100-N. Switch 895 can include electrode 82 for controlling the charging state of link 315-N-1,N between qubit device 100-N-1 and 100-N. Alternately, switch 895 can include a superconducting SET or parity key, for coherently coupling the respective qubit devices. FIG. 7 illustrates a parity key that includes two tunnel junctions, 316-N-1 and 316-N, link 315-N-1,N, and electrode 82, wherein electrode 82 is capacitively coupled to link 315-N-1,N.

Figure 8:
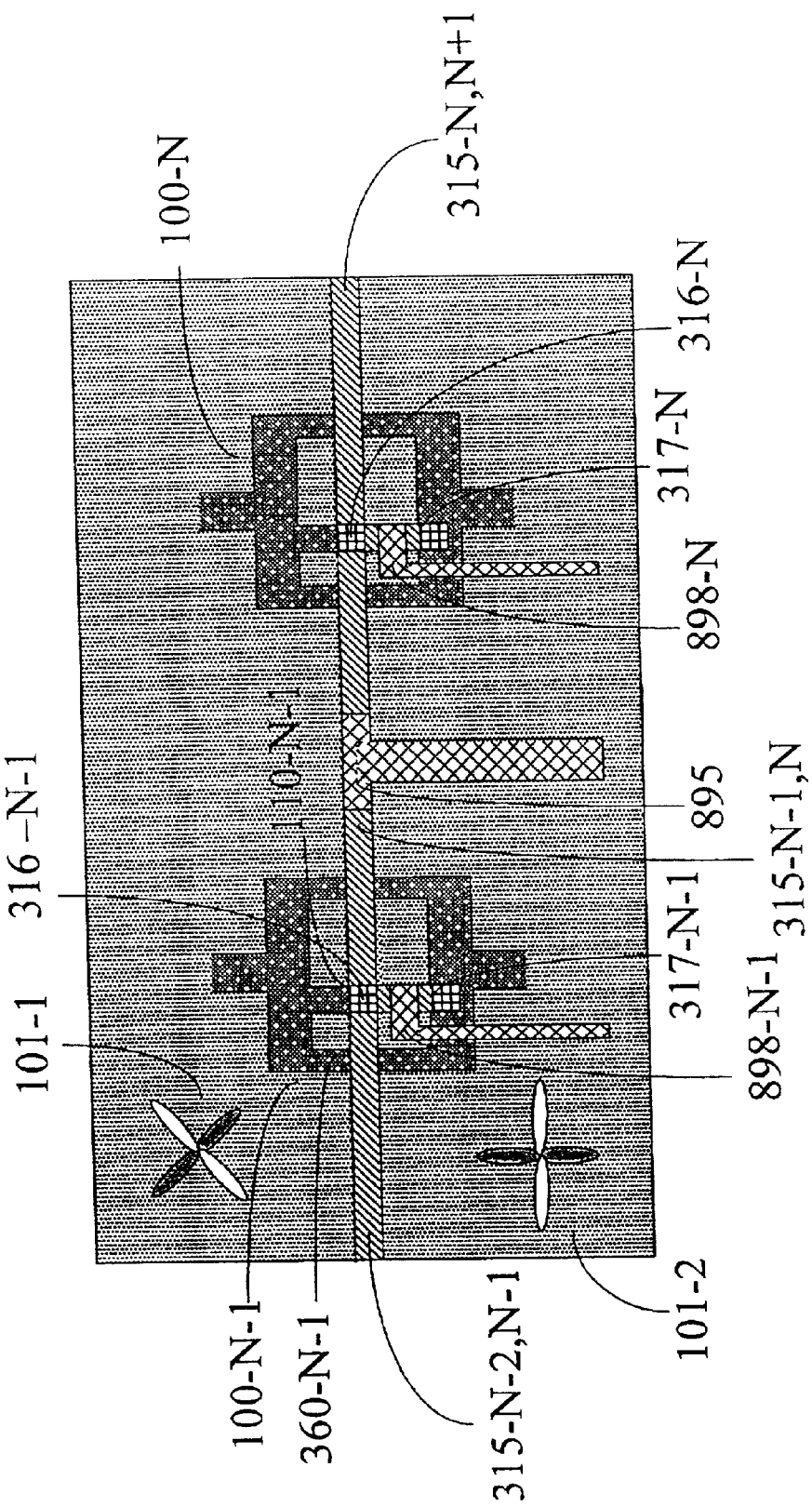
FIG. 8 illustrates a plan view of a plurality of quantum registers in accordance with another embodiment of the invention.

FIG. 8 illustrates a mechanism for providing a biasing operation or $\hat{\sigma}_z$ or bias gate can be introduced the finger SQUID qubit device 100-N-1 by providing a coherent, superconducting link 317-N-1 between superconducting island 110-N-1 and a region of superconducting loop 360-N-1. FIG. 8 illustrates this connection, wherein a coherent, controllable superconducting link 317-N-1 is provided between superconducting island 110-N-1 and superconducting loop 360-N-1. Link 317-N-1 can be controlled by coherent switching mechanism 898-N-1, where coherent switching mechanism 898-N-1 may include a superconducting SET as described above for the qubit—qubit controllable coupling mechanism 895.

Figure 9:
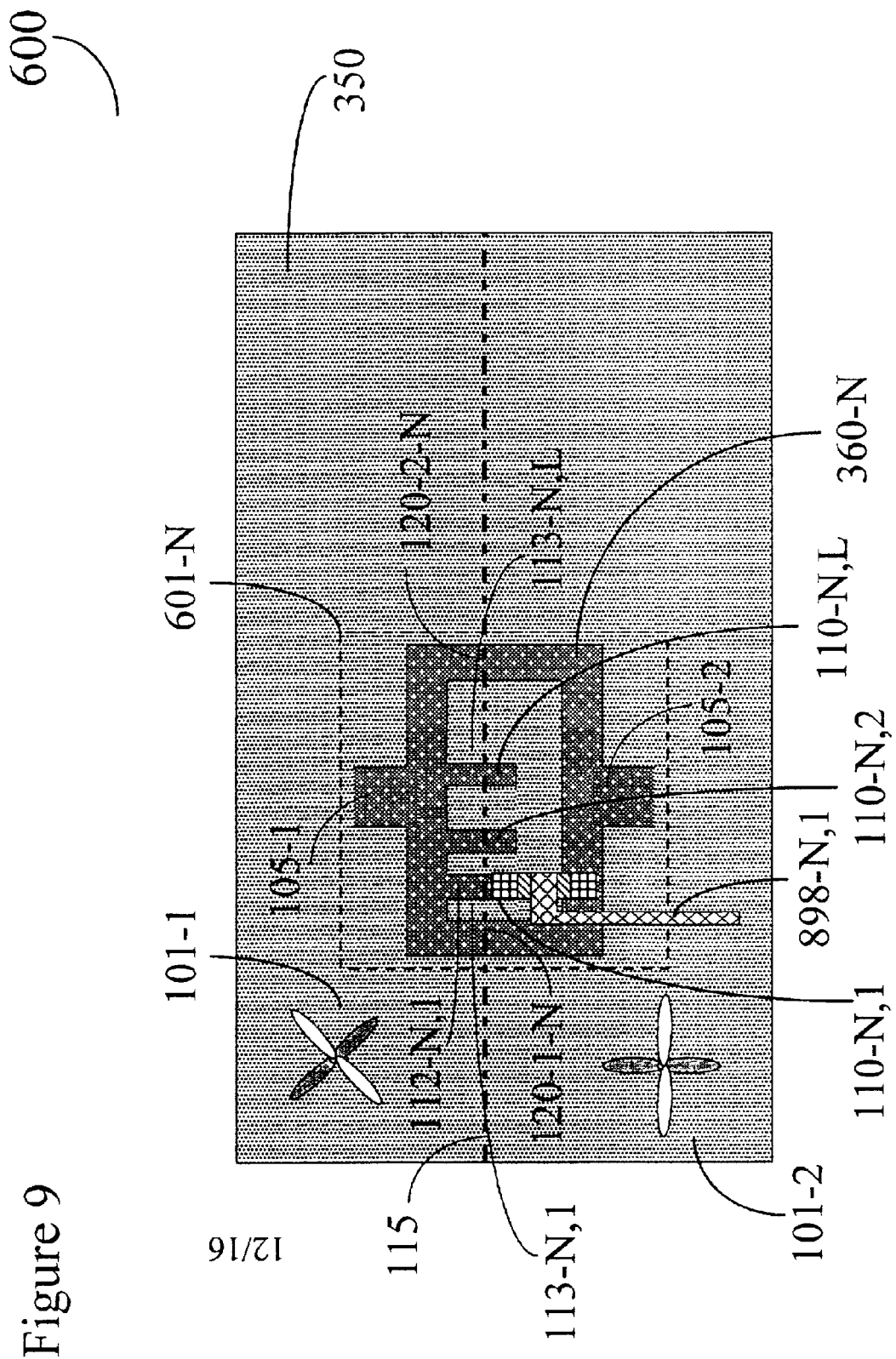
FIG. 9 illustrates a plan view of a quantum register in accordance with another embodiment of the invention.

Some embodiments of the invention can include a plurality of superconducting fingers extending to the interior of a single superconducting loop. Since the quantum information is stored at the Josephson junction in the finger, the superconducting loop becomes a quantum register 601-N for controlling a plurality of qubits. FIG. 9 illustrates a quantum register 600, which includes quantum register 601-N in accordance with an embodiment of the invention. Quantum register 601-N includes a superconducting loop 360-N, wherein L superconducting fingers and L corresponding superconducting mesoscopic islands 110-N,1 through 110-N,L can be formed. Quantum register 600 can also include one or more of quantum registers 601. Passing current across the leads of superconducting loop 360-N, such that the current is greater than the critical current of Josephson junctions 120-1-N and 120-2-N respectively, can have the effect of collapsing the wavefunction of one or more of the qubits 113-N,1 through 113-N,L in quantum register 601-N, thus providing the basis for readout and initialization operations. Further, qubits in quantum register 601-N may be entangled by coupling any of the qubits 113-N,1 through 113-N,L. For example, qubits 113-N,1 through 113-N,L may be coupled by providing a controllable coupling mechanism 895 as described above with regard to FIG. 8.

Furthermore, in some embodiments, bias operations, readout and initialization can be performed on each qubit 113-N,1 through 113-N,L separately. To perform a bias operation, readout, or initialization on qubit 113-N,1, a controllable, coherent superconducting link similar to link 317-N of FIG. 8 can be provided between superconducting island 110-N,1 and superconducting loop 360-N.

A method for biasing the state of a qubit in quantum register 601-N of FIG. 9, wherein a controllable, coherent superconducting link is provided between the island 110-N,1 and superconducting loop 360-N, includes closing switch 898-N,1 such that island 110-N,1 is coherently coupled to loop 360-N.

A method for initializing the state of qubit 113-N,1 includes closing switch 898-N,1 such that island 110-N,1 is coherently coupled to superconducting loop 360-N, and driving a bias current across the leads of superconducting loop 360-N. The direction of the bias current passing through superconducting finger 112-N,1 correlates with one of the basis states of qubit 113-N,1. For example, passing a bias current through finger 112-N,1 in a first direction can initialize qubit 113-N,1 to a first basis state, and passing a bias current through finger 112-N,1 in a second direction can initialize qubit 113-N,1 to a second basis state. This operation will select a state in qubit 113-N,1 that corresponds with the direction of the bias current. In some embodiments, the bias current can exceed the critical current of the junction. Although FIG. 9 does not show a switch for each qubit 113-N,1 through 113-N,L, a switch may be provided for each qubit in quantum register 601-N.

A method for reading out the state of a qubit in quantum register 601-N includes closing switch 898-N,1 such that island 110-N,1 is coherently coupled to superconducting loop 360-N, passing a bias current across the leads 105-1 and 105-2, and measuring the potential change across the leads. Driving a bias current through superconducting finger 112-N,1 has the effect of biasing one of the qubit basis states. If the bias current exceeds the critical current of the Josephson junction on finger 112-N,1, then the junction enters the dynamical regime and a voltage results. When the bias current is driven through finger 112-N,1, qubit 113-N,1 will first collapse to one of its basis states. This first collapse is based on the quantum state of qubit 113-N,1 and not the direction of the bias current. In a first case, the collapsed state of qubit 113-N,1 correlates with the direction of the bias current, thus resulting in a first characteristic voltage behaviour at the junction. In a second case, the collapsed state of qubit 113-N,1 will correlate with an opposing bias current, thus resulting in a second characteristic voltage behaviour. Thus, measuring the potential change across leads 105-1 and 105-2 provides a measurement of the characteristic voltage resulting from the bias current. By correlating the resulting characteristic voltage with the basis states of qubit 113-N,1, a readout operation can be performed. In all of the above cases the duration of the current pulse depends on the embodiment of the invention. The duration of the current pulse can be on the order of the tunneling amplitude of qubit 113-N,1. The current pulse can have a duration τ ranging as $\Delta_{min} \leq 1/\tau \leq 5\Delta_{max}$, where $\Delta_{min}$ is the smallest tunneling amplitude in quantum register 601-N, and Amax is the largest tunneling amplitude in quantum register 601-N. Furthermore, the magnitude of the bias current depends upon the embodiment of the invention. The bias current can have a magnitude ranging between $0 \leq |I_B| \leq 5I_c^{max}$, where $I_c^{max}$ is the largest critical current of the superconducting finger junction in quantum register 601-N. In some embodiments of the invention the bias current can range between 0 and $2I_c^{max}$.

Figure 10:
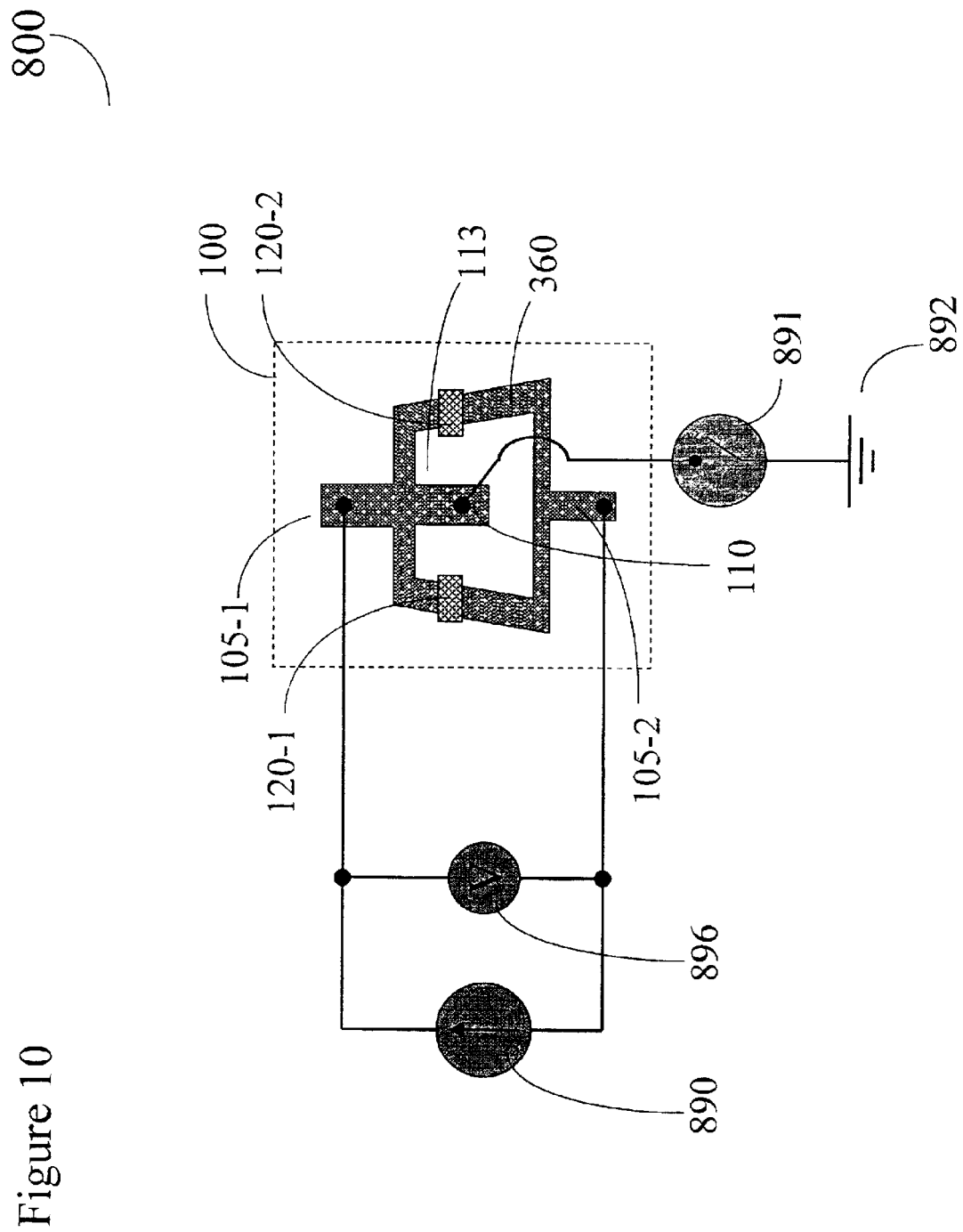
FIG. 10 illustrates a plan view of a control system for a qubit according to an embodiment of the present invention.

In order that a qubit device be useful as a quantum register, a mechanism to readout and initialize the state of the qubit is provided. The finger SQUID qubit device provides a robust system for providing readout and initialization operations. When the qubit is decoupled from its surroundings, it evolves quantum mechanically as a superposition of its basis states. Referring to FIG. 10, if superconducting island 110 is grounded, qubit 113 becomes coupled to its surroundings and the wavefunction collapses, leaving qubit 113 restricted to one of its basis states. Island 110 can be grounded, for example, by closing switch 891. While grounded, qubit 113 cannot evolve quantum mechanically and is said to hold classical information because it occupies one of its ground states (basis states) which can be treated as the bitstates 0 and 1.

A method for performing a quantum computation using an embodiment of the invention includes initializing each of the qubits in a quantum register (to one basis state), evolving the qubits in the quantum register according to the applied quantum algorithm, wherein evolving the qubit includes application of the quantum operations provided by the embodiment of the invention, grounding the qubits in the quantum register to collapse the wavefunction of the respective qubits, and reading out the state of each of the qubits in the quantum register. In some embodiments, a separate grounding operation is not performed. A separate grounding operation is not required since the qubits collapse into a basis state upon a measurement of the qubit state, including when executing a readout operation. In some methods for performing quantum computation, readout of the state of the qubit can be performed throughout the calculation. See e.g., P. Shor, U.S. Pat. No. 5,768,297, referenced above.

A mechanism for grounding the qubit includes a mechanism for decohering the wavefunction of the qubit. Referring again to FIG. 10, an embodiment of the current invention can include a grounding mechanism wherein superconducting island 110 is connected to ground 892. Since the basis states of qubit 113 are characterized by a phase change ±ΔΦ across junction 111 with respect to the phase Φ of the superconducting order parameter in the region of the device from which finger 112 extends, grounding island 110 can fix the phase of qubit 113 to either the |+ΔΦ⟩ or |−ΔΦ⟩ state. Ground 892 can be a bulk superconductor having a fixed phase. A superconducting link between superconducting island 110 and ground 892 can include a grounding switch 891, for coupling and decoupling qubit 113 to ground 892. Grounding switch 891 can be a SET device or a parity key. When grounding switch 892 is closed, qubit 113 is fixed to a single basis state, and when grounding switch 891 is open, qubit 113 decouples from its surroundings and can evolve quantum mechanically as a superposition of its basis states.

FIG. 10 illustrates a grounding switch 891 and ground 892. Superconducting island 110 is connected directly to grounding switch 891 such that if the switch is open island 110 can be decoupled from ground 892 and if the switch is closed island 110 can be coupled to ground 892. When island 110 is coupled to ground 892, qubit 113 will remain fixed to one of its basis states. The grounding system has been described in detail in U.S. patent application Ser. No. 09/872,495, M. Amin, G. Rose, A. Zagoskin, and J. Hilton, "Quantum Processing System for a Superconducting Phase Qubit", filed Jun. 1, 2001, and the references therein, herein incorporated by reference in its entirety.

Another mechanism for grounding a finger SQUID qubit device includes driving a current across the leads of the device. Referring again to FIG. 10, in operation, if no current is driven across device leads 105-1 and 105-2, superconducting island 110 may be decoupled from its surroundings and thus the state of the qubit can evolve quantum mechanically. When a current is driven across the leads of the device the superconducting loop couples to superconducting island 110 and the qubit wavefunction collapses into one of its basis states.

In another embodiment of the invention, a bias operation can be performed by driving a current across leads 105-1 and 105-2 of FIG. 10, such that the current is less than the critical current of Josephson junctions 120-1 and 120-2. If the current is less than the critical current of junctions 120-1 and 120-2, the quantum state of the qubit will not collapse. The sign of the current across leads 105-1 and 105-2 can be chosen to select the state to be biased. For example, driving a current with a magnitude I, from lead 105-1 to lead 105-2 can bias the quantum state of the qubit 113 towards a first state, and driving a current with a same magnitude I, from lead 105-2 to 105-1 can bias the quantum state of the qubit 113 to a second state. Thus, although a controllable coherent link between the superconducting island 110 and superconducting loop 360 may be used to initialize and readout the qubit, such a link is not necessary.

In accordance with an embodiment of the invention, finger SQUID qubit device 100 can be placed in a control system 800 providing a mechanism for driving a bias current across leads 105-1 and 105-2 of FIG. 10, and a mechanism for measuring a potential change across leads 105-1 and 105-2. Furthermore, control system 800 can include a mechanism for controllably coupling superconducting island 110 to superconducting loop 360, or a mechanism for controllably coupling superconducting island 110 to ground 892.

The control system illustrated in FIG. 10 provides a mechanism 890 for driving a bias current across the leads of the qubit device, a mechanism 896 for measuring the potential change across the leads of the device, and a grounding switch 891 for grounding the island 110 of the device to ground 892. Such a control system can provide all of the operations required to perform quantum computation, such as initialization, application of quantum gates, grounding, and readout of the qubit state. In some embodiments of the invention, the grounding switch 891 can be left out of the control system, and grounding the qubit can include driving a current across the leads of the device.

After grounding, qubit 113 has collapsed to one of its basis states. A mechanism for performing a readout operation on qubit 113 includes a mechanism for reading out the basis state that qubit 113 occupies. Thus, a mechanism for performing a readout operation on qubit 113 can include grounding qubit 113, applying a current across the leads of the device 105-1 and 105-2, and measuring the response of the current. When a current is driven across the leads of the device 105-1 and 105-2, a response can be measured that depends on which basis state qubit 113 occupies, as described previously. Another embodiment of a mechanism for performing a readout operation on qubit 113 includes applying a bias current between the leads 105-1 and 105-2, and measuring the resulting potential change across the device.

Figure 11:
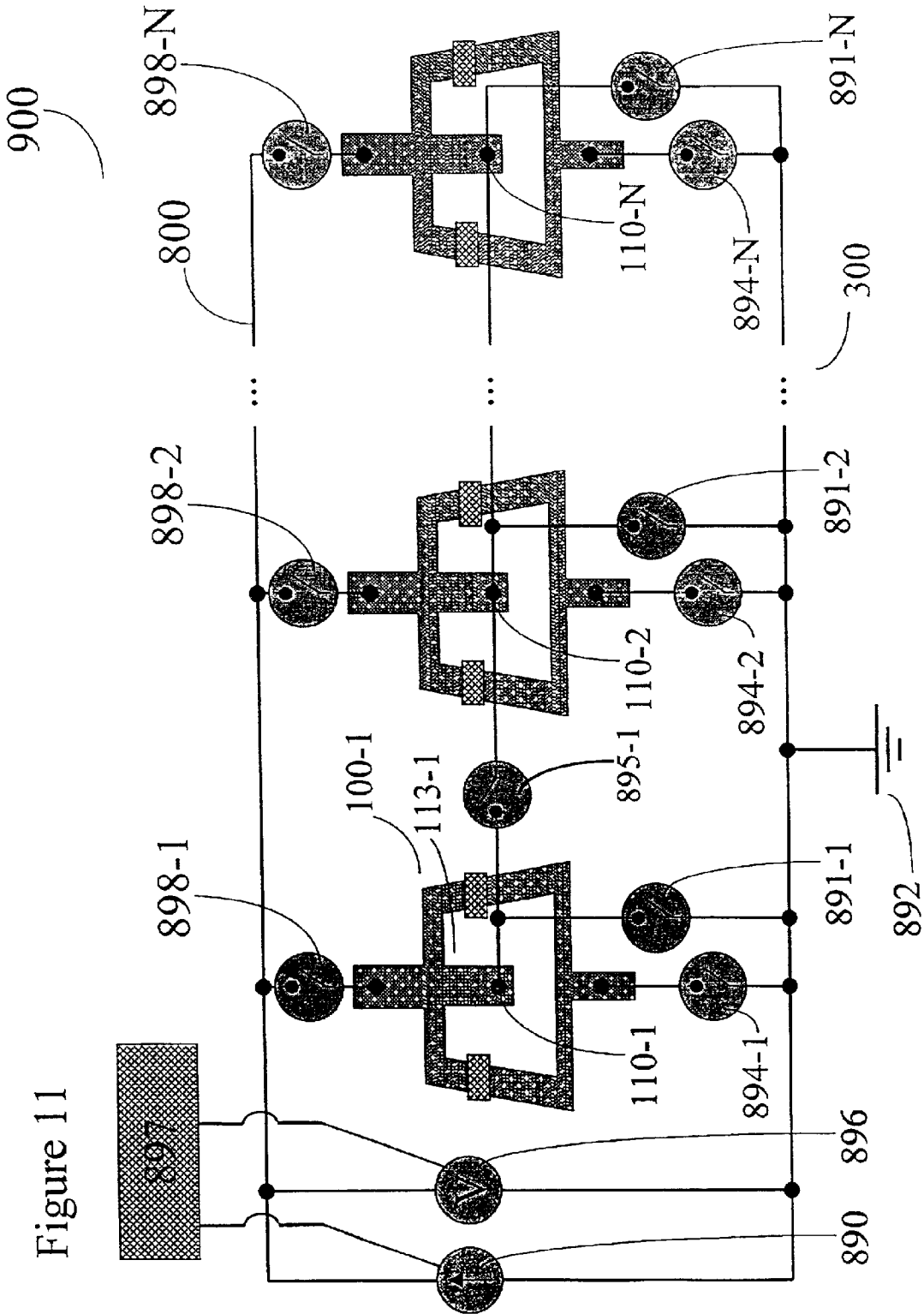
FIG. 11 illustrates a plan view of a quantum processor according to the present invention.

FIG. 11 illustrates a plan view of a quantum processor 900 including control system 800 wherein a readout operation for the state of a finger SQUID qubit device can be performed. System 800 includes quantum register 300 of N finger SQUID qubit devices, current source 890, voltage measuring device 896, coupling switches 895-1 to 895-N-1, current switches 894-1 to 894-N, branch switches 898-1 to 898-N, and island grounding switches 891-1 to 891-N. The control system illustrated in FIG. 11 can ground and perform a readout operation on each of the qubits in register 300. A method for reading out the state of a register of finger SQUID qubit devices includes closing the switch 894-1, driving a current with the current source 890, and measuring a voltage with the voltage measuring device 896. The process can then be repeated for each qubit in the register.

Another method for reading out the state of a finger SQUID qubit device register includes closing a switch 891-1, such that the respective superconducting island 110-1 is grounded, then driving a current with current source 890, and measuring the potential change with voltage measuring device 896, then repeating the process for each qubit in the register. The value measured by voltage measuring device 896 can be correlated with the basis state of the qubit and that information can be transferred to a binary memory device. For example, FIG. 11 further shows a classical driver system 897 for controlling the operations in the quantum register. Classical driver system 897 can provide a classical memory for storing output from the quantum calculations. Furthermore, classical driver system 897 can store a set of operations to run on the quantum register. Classical driver system 897 can, for example, include a conventional microprocessor with memory to store programs and data.

A control system such as that illustrated in FIG. 11 provides a mechanism for initialization of the qubit state. The state that each qubit in the register is initialized to depends on the quantum algorithm to be calculated. In some embodiments, all the qubits in the quantum register can be initialized to the basis state |1> (as stated above, the |0> state may arbitrarily be chosen as either of the two basis states |+ΔΦ> or |−ΔΦ>). Initialization of finger SQUID qubit 113-1 includes closing current switch 894-1, and driving a current using a current source 890 for a duration τ. The duration τ can vary over a range as described above for the quantum register operations. Driving a current across the leads of device 100-1 has the effect of biasing one of the basis states of qubit 113-1. Once current switch 894-1 has been opened, qubit 113-1 will no longer be grounded, and it can begin to evolve quantum mechanically. By repeating the process, each of the qubits 113-1 through 113-N may be initialized in series. Another method for initializing the state of quantum register 300 can include simultaneously initializing N qubits in the quantum register of system 800 to the same basis state. A method for initializing N qubits in a quantum register of finger SQUID qubit devices in parallel can include closing current switches 894-1 through 894-N concurrently, and driving a current using current source 890. The current travels across the leads of each of the qubit devices in the register, therein initializing the qubit to the basis state corresponding to the direction of the current.

An alternative embodiment of the control system 800 can include only one set of switches 894-1 to 894-N or 891-1 to 891-N. Since a mechanism for grounding, readout, and initialization can be implemented using only one set, a control system does not require both sets of switches. For example, in an embodiment of the control system 800, switches 891-1 through 891-N are not present. A mechanism for initializing qubit 113-1 can include closing switch 891 and driving a current using the current source 890. Furthermore, a mechanism for readout of the state of the quantum register can include closing switch 894, driving a current using the current source 890, and measuring the resulting potential change using the voltage measuring device 896. The measured voltage can then be correlated with the respective basis state of the qubit and then transferred to a memory register. The classical memory register may be included in classical driver system 897 of system 800.

Figure 13:
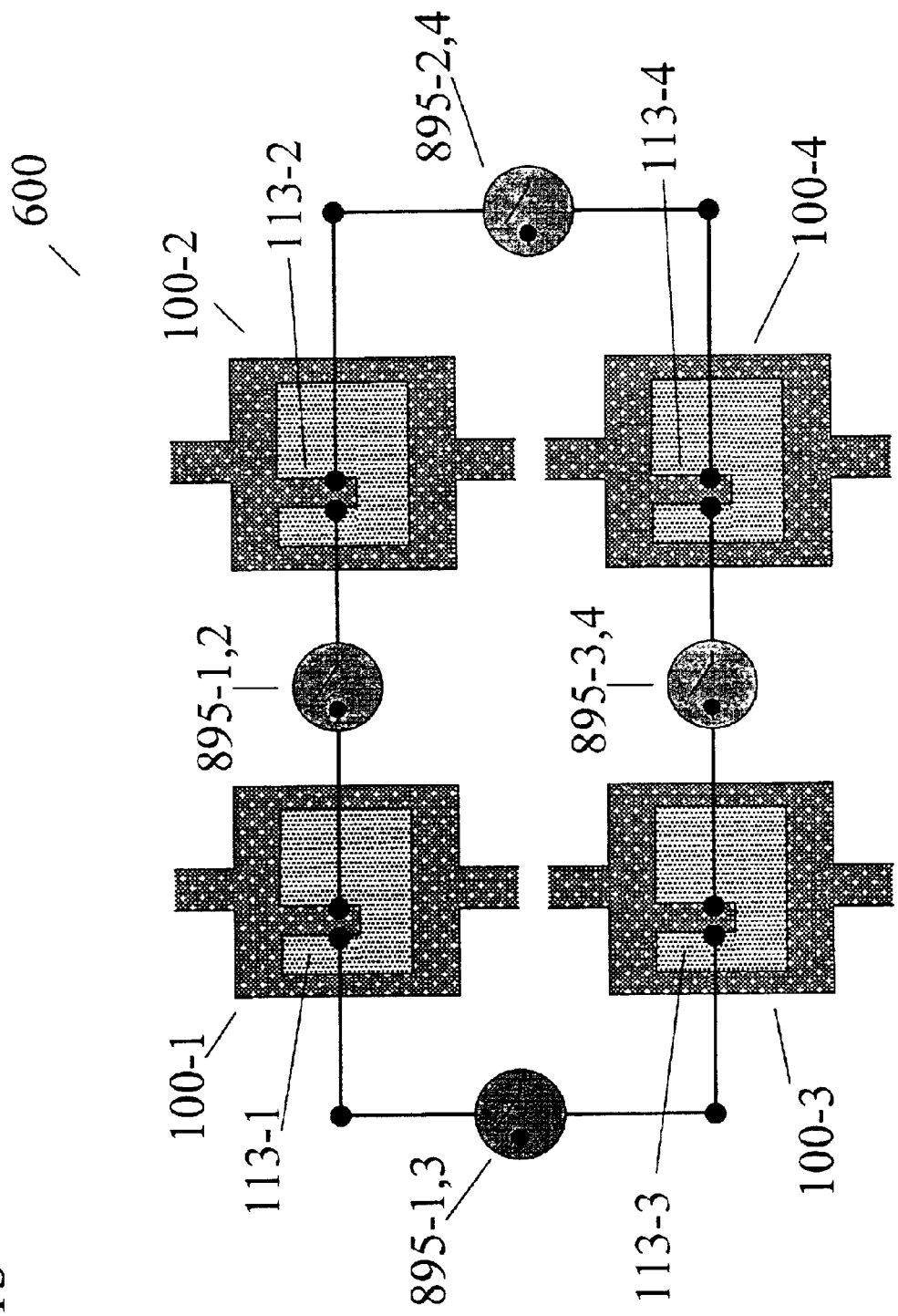
FIG. 13 illustrates a quantum register in accordance with an embodiment of the invention.

In some embodiments of the invention, a quantum register can contain a multi-dimensional array of finger SQUID qubit devices. For example, FIG. 13 shows a two dimensional array of finger SQUID qubit devices. The superconducting island 100 of each of the devices may be connected to the superconducting islands of other qubit devices in the array. Alternately, in accordance with another embodiment of the invention, a control system can include a separate current source and voltage measurement device for each qubit in quantum register 300. For example, FIG. 11 may be modified so that each qubit device 100-1 through 100-N has a current source and a voltage measurement device. Thus each qubit can be directed independently of other qubits, and the qubit—qubit coupling can be accomplished as described previously. See, e.g., commonly assigned patent application Ser. No. 09/872,495, "Quantum Processing System and Method for a Superconducting Phase Qubit," assigned to the same assignee as is the present disclosure, which is hereby incorporated by reference in its entirety.

In some embodiments, voltage measurement device 896 can be a radio-frequency single electron transistor (RF-SET), capable of measuring a magnitude on the order of microvolts on a time-scale of picoseconds. See i.e., R. J. Schoelkopf, P. Wahlgren, A. A. Kozhevnikov, P. Delsing, D. E. Prober "The Radio-Frequency Single-Electron Transistor (RF-SET): A Fast and Ultrasensitive Electrometer", Science, 280, 1238 (May 1998), herein incorporated by reference in its entirety.

Figure 12:
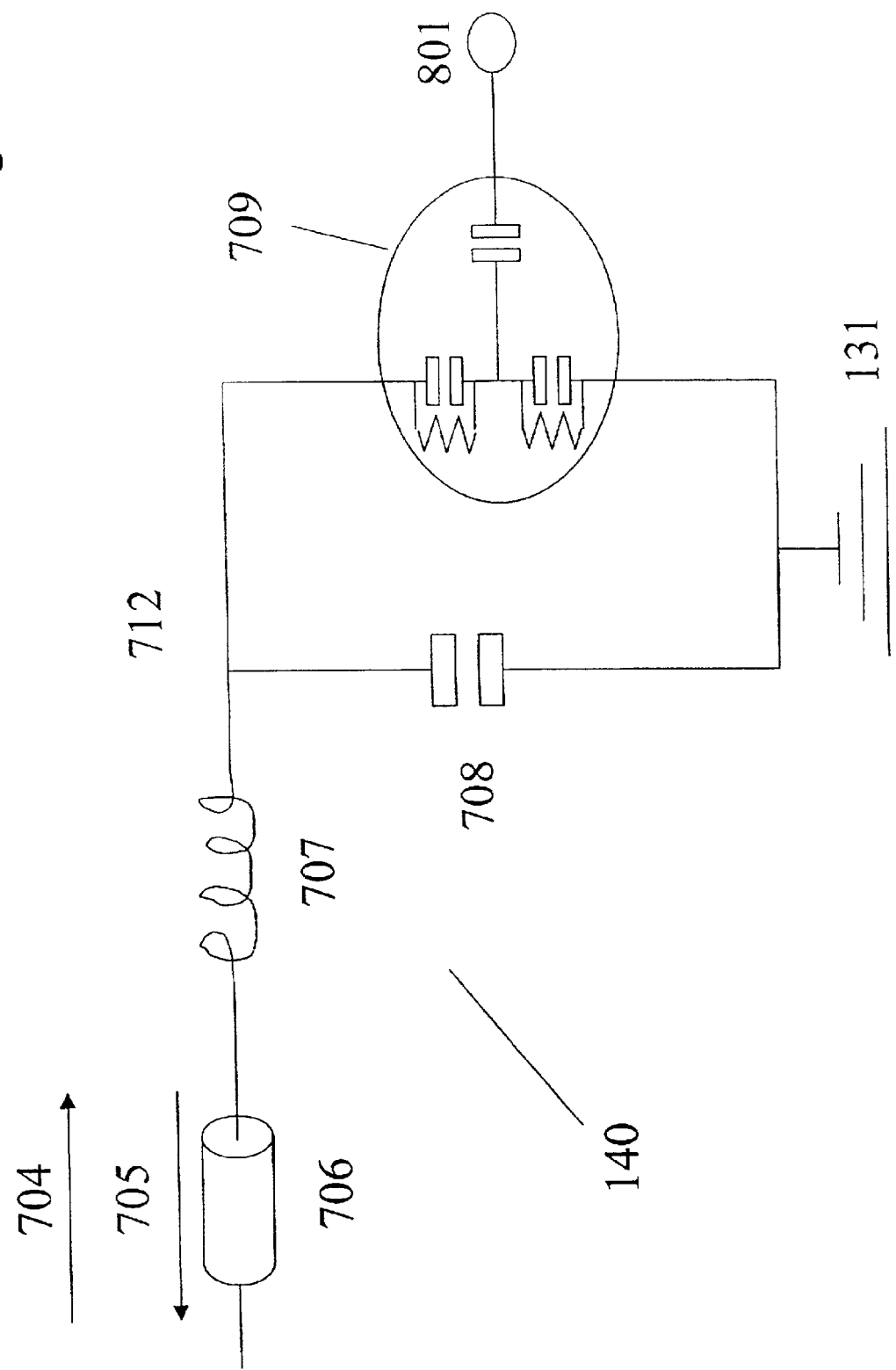
FIG. 12 illustrates a plan view of an RF-SET voltmeter.

Referring to FIG. 12, RF-SET voltmeter 140 is comprised of superconducting SET 709, tank circuit 712, and port 706 for applying and detecting a signal. SET 709 can be made of any superconducting material, for example niobium, aluminum, lead, tin, or any high-temperature superconducting cuprate. A RF-SET as described in R. Schoelkopf et al., can include a SET placed in a high quality factor tank circuit tuned to resonance. Tank circuit 712 can include an inductor and a capacitor. The capacitor is coupled in parallel with SET 709. A third terminal of SET 709 is coupled to an electrode. In operation, a radio-frequency or microwave signal is introduced into tank circuit 712. The reflected signal is a function of the conductance of SET 709. Analysis of the reflected signal using established techniques allows measurement of the voltage difference between the electrode and ground.

In accordance with an embodiment of the invention, control system 800 can perform quantum calculations. Classical driver system 897 in FIG. 11 illustrates an aspect of the invention that can coordinate the timing of current pulses and voltage measurements, thus interpreting the information coming out of quantum register 300 Some embodiments of the control system can include control leads for manipulating the state of all switches. Such a control system would provide the capacity for the classical driver system 897 to direct the qubit to be operated on in quantum register 300.

Quantum computation generally includes initializing a quantum register to some classical value, performing a sequence of quantum gate operations on the qubits in the register, and reading out a classical value for the qubits used in the calculation. In accordance with an embodiment of the invention, a quantum register such as quantum register 300 of FIG. 11 can perform a quantum computation when combined with a control system such as 800 and a classical driver system such as 897 to form a quantum processor 900. The temperature of the system is generally low enough to suppress thermal excitations. The system can have an environment temperature on the order of $10^{-3}$ Kelvin to 1 Kelvin. Similarly, the classical driver system 897 can run in the same environment as the control system and quantum register. In some embodiments of the invention, the classical driver system 897 can be formed on the same chip as the other aspects of the quantum processor. In another embodiment of the invention, the control system and quantum register can be at a low enough temperature to perform quantum computation, and the classical driver system can run in a separate environment, having leads which interface with the control system.

In some embodiments of the invention, a quantum register may include a plurality of qubits, where each qubit may be coupled to one or more of the other qubits in the quantum register. FIG. 13 shows a quantum register 600 which includes a plurality of qubit devices 100-1 through 100-4 in a two dimensional array. A three dimensional array of qubit devices may be used as well. Additionally, a larger number of qubit devices may be used.

FIG. 13 shows quantum register 600 with four qubit devices 100-1 through 100-4 with qubits 113-1 through 113-4. Each qubit may be coupled to any or all of the other qubits in quantum register 600. For example, coupling switches 895-1,2, 895-2,4, 895-3,4, and 895-1,3 shown in FIG. 13 may be used to couple qubits as shown here. Coupling switches 895-1,2, 895-2,4, 895-3,4, and 895-1,3 may be superconducting SETs or parity keys. Other methods of coupling multiple qubits may be used. For example, although FIG. 13 does not show a coupling switch between qubit 113-2 and qubit 113-3, such a coupling switch may be provided.

Although the invention has been described with reference to particular embodiments, the embodiments specifically described are only examples of the invention's application and should not be taken as limiting. One skilled in the art will recognize variations that are within the spirit and scope of this invention. Various adaptations and combinations of features of the embodiments disclosed are within the scope of the invention as defined by the following claims.

We claim:

1. A method of performing a calculation with a quantum computer, comprising:

provising a plurality of qubit devices including a first qubit device and a second qubit device, each of said plurality of qubit devices including a superconducting loop and one or more superconducting fingers, said superconducting loop including at least one Josephson junction, each of said one or more superconducting fingers extending from said superconducting loop towards the interior of said superconducting loop, each of said one or more superconducting fingers further including a mesoscopic island separated from the rest of said superconducting finger by a finger Josephson junction;

initializing each of said qubits, including initializing a first qubit and a second qubit;

performing a calculation, including performing an entanglement operation on said first qubit and said second qubit; and reading out the result of the calculation, including measuring a first qubit value and a second qubit value.

2. The method of claim 1, wherein performing an entanglement operation comprises coherently coupling said first qubit device to said second qubit device.

3. The method of claim 1, wherein performing a calculation further comprises performing a bias operation on said first qubit.

4. The method of claim 1, wherein performing a calculation further comprises performing a tunnel matrix operation on said first qubit.

5. The method of claim 1, wherein performing an entanglement operation further comprises performing a controlled phase shift on said first qubit.

6. The method of claim 1, further comprising storing the results of said calculation in a memory, including storing said first qubit value in said memory.

7. The method of claim 1, wherein said first qubit device includes a first superconducting loop and a first mesoscopic island, and wherein measuring said first qubit value includes providing a link between said first superconducting loop and said first mesoscopic island, providing current through said first qubit device, and measuring a voltage across said first qubit device.

8. The method of claim 1, wherein measuring said first qubit value includes providing current through said first qubit device, and measuring a voltage across said first qubit device.

9. The method of claim 1, wherein said first qubit device includes a first mesoscopic island, and wherein measuring said first qubit value includes grounding said first mesoscopic island, providing current through said first qubit device, and measuring a voltage across said first qubit device.

10. The method of claim 1, wherein said first qubit device includes a first mesoscopic island and said second qubit device includes a second mesoscopic island and wherein performing an entanglement operation on said first qubit and said second qubit includes providing a link between said first mesoscopic island and said second mesoscopic island.

11. A method of initializing a qubit, the method comprising:

providing a qubit device including a qubit, said qubit having two qubit basis states, said qubit device comprising a material capable of superconducting, said qubit device including a loop and a finger, said loop including at least one Josephson junction, said finger extending from said loop towards the interior of said loop, said finger further including a mesoscopic island separated from the rest of said finger by a finger Josephson junction, said qubit device further including a first lead and a second lead configured to provide current to said loop; and initializing said qubit to one of said two qubit basis states.

12. The method of claim 11, wherein said qubit includes said finger.

13. The method of claim 11, wherein initializing said qubit includes connecting said mesoscopic island of said finger to a ground.

14. The method of claim 11, wherein initializing said qubit includes connecting said mesoscopic island of said finger to said loop.

15. The method of claim 14 wherein said initializing said qubit further includes driving a bias current across said first and second leads of said loop.

16. The method of claim 11, wherein initializing said qubit includes providing a bias current through said first and second leads.

17. A method for entangling a first qubit with a second qubit, said method comprising:

providing a first qubit device having a first qubit, said first qubit device including a superconducting loop and a superconducting finger, said superconducting loop including at least one Josephson junction, said superconducting finger extending from said superconducting loop towards the interior of said superconducting loop, said superconducting finger further including a first mesoscopic island separated from the rest of said superconducting finger by a finger Josephson junction;

providing a second qubit device having a second qubit, said second qubit device including a superconducting loop and a superconducting finger, said superconducting loop including at least one Josephson junction, said superconducting finger extending from said superconducting loop towards the interior of said superconducting loop, said superconducting finger further including a second mesoscopic island separated from the rest of said superconducting finger by a finger Josephson junction; and coupling said first qubit to said second qubit.

18. The method of claim 17, wherein coupling said first qubit to said second qubit includes providing a link between said first mesoscopic island and said second mesoscopic island.

19. The method of claim 18, said link between said first mesoscopic island and said second mesoscopic island includes a switch, and wherein coupling said first qubit to said second qubit includes closing said switch so that supercurrent can flow between said first mesoscopic island and said second mesoscopic island.

20. The method of claim 19, wherein said switch includes a superconducting single electron transistor.

21. The method of claim 19, wherein said switch includes a parity key.

22. A method of performing a bias operation on a qubit, said method comprising:

providing a qubit device including a qubit, said qubit device including a superconducting loop and a superconducting finger, said superconducting loop including at least one Josephson junction, said superconducting finger extending from said superconducting loop towards the interior of said superconducting loop, said superconducting finger further including a mesoscopic island separated from the rest of said superconducting finger by a finger Josephson junction;

linking said mesoscopic island to said superconducting loop, wherein said linking is accomplished using a coherent switching mechanism.

23. The method of claim 22, wherein said coherent switching mechanism includes a parity key device.

24. The method of claim 22, wherein said coherent switching mechanism includes a superconducting single electron transistor device.

25. A method for performing a bias operation on a qubit device, said method comprising:

providing a qubit device including a qubit, said qubit device including a superconducting loop and a superconducting finger, said superconducting loop including at least one Josephson junction, said superconducting finger extending from said superconducting loop towards the interior of said superconducting loop, said superconducting finger further including a mesoscopic island separated from the rest of said superconducting finger by a finger Josephson junction, said qubit device further including a first lead and a second lead configured to provide current to said superconducting loop; and driving a current across said first and second leads.

26. The method of performing a bias operation of claim 25, wherein driving said current across said first and second leads in a first direction biases said qubit device to a first qubit basis state and wherein driving said current across said first and second leads in a second direction opposite to said first direction biases said qubit device to a second qubit basis state.

27. A method of reading out the state of a qubit, said method comprising:

providing a qubit device including a qubit, where said qubit device includes a superconducting loop having a first lead and a second lead and a superconducting finger extending toward the interior of said loop, said superconducting finger including a mesoscopic island separated from the rest of said finger by a Josephson junction;

coupling said mesoscopic island to said superconducting loop;

driving a bias current through said first and second leads; and measuring a voltage across said first and second leads.

28. The method of claim 27, wherein said qubit includes said finger.

29. A method of reading out the state of a qubit, said method comprising:

providing a qubit device including a qubit, where said qubit device includes a superconducting loop having a first lead and a second lead and a superconducting finger extending toward the interior of said loop, said superconducting finger including a mesoscopic island separated from the rest of said finger by a Josephson junction;

grounding said qubit;

applying a current across said first and second leads of said qubit device; and measuring a voltage across said first and second leads of said qubit device.

30. A method of grounding a qubit, said method including:

providing a qubit device including a qubit, where said qubit device includes a superconducting loop and a superconducting finger extending toward the interior of said loop, said superconducting finger including a mesoscopic island separated from the rest of said finger by a Josephson junction; and connecting said mesoscopic island to a ground.

31. The method of claim 30, wherein said qubit includes said superconducting finger.

32. A method of grounding a qubit, said method including:

providing a qubit device including a qubit, where said qubit device includes a superconducting loop having a first lead and a second lead and a superconducting finger extending toward the interior of said loop, said superconducting finger including a mesoscopic island separated from the rest of said finger by a Josephson junction; and driving current across said first and second leads.

33. A method for entangling a plurality of qubits, said method including:

providing a plurality of qubit devices, each of said qubit devices including a superconducting loop having one or more superconducting fingers extending toward the interior of said loop, each of said superconducting fingers including a mesoscopic island separated from the rest of said finger by a Josephson junction, wherein each of said superconducting fingers forms a qubit; and entangling a first qubit with a second qubit.

34. The method of claim 33, further including entangling said first qubit with a third qubit.

35. The method of claim 34, wherein said first qubit is entangled with both said second qubit and said third qubit at a time T.

* * * * *